US010128404B2

(12) United States Patent
Atanackovic

(10) Patent No.: US 10,128,404 B2
(45) Date of Patent: Nov. 13, 2018

(54) ELECTRONIC DEVICES COMPRISING N-TYPE AND P-TYPE SUPERLATTICES

(71) Applicant: Silanna UV Technologies Pte Ltd, Singapore (SG)

(72) Inventor: Petar Atanackovic, Henley Beach South (AU)

(73) Assignee: Silanna UV Technologies Pte Ltd, Singapore (SG)

( * ) Notice: Subject to any disclaimer, the term of this patent is extended or adjusted under 35 U.S.C. 154(b) by 0 days.

(21) Appl. No.: 15/594,015

(22) Filed: May 12, 2017

(65) Prior Publication Data

US 2017/0263809 A1 Sep. 14, 2017

Related U.S. Application Data

(60) Division of application No. 14/976,208, filed on Dec. 21, 2015, now Pat. No. 9,685,587, which is a
(Continued)

(30) Foreign Application Priority Data

May 27, 2014 (AU) .................................. 2014902009
May 27, 2014 (AU) .................................. 2014902010

(51) Int. Cl.
*H01L 31/00* (2006.01)
*H01L 33/00* (2010.01)
(Continued)

(52) U.S. Cl.
CPC ...... *H01L 33/0075* (2013.01); *H01L 29/1606* (2013.01); *H01L 31/03042* (2013.01);
(Continued)

(58) Field of Classification Search
CPC ... H01L 33/06; H01L 29/1606; H01L 29/167; H01L 31/0288; H01L 31/03042;
(Continued)

(56) References Cited

U.S. PATENT DOCUMENTS 732,956 A 7/1903 Palmer
4,972,246 A 11/1990 Brodsky et al.
(Continued)

FOREIGN PATENT DOCUMENTS

CN 102208511 A 10/2011
CN 102534764 A 7/2012
(Continued)

OTHER PUBLICATIONS

Bulashevich and Karpov, Heterojunctions between group-III nitride short-period superlattices, Phys. Stat. Solid. (c), Apr. 2005, 2(7) pp. 2394-8.
(Continued)

*Primary Examiner* — Vu A Vu
(74) *Attorney, Agent, or Firm* — The Mueller Law Office, P.C.

(57) ABSTRACT

A superlattice and method for forming that superlattice are disclosed. In particular, an engineered layered single crystal structure forming a superlattice is disclosed. The superlattice provides p-type or n-type conductivity, and comprises alternating host layers and impurity layers, wherein: the host layers consist essentially of a semiconductor material; and the impurity layers consist of a donor or acceptor material.

18 Claims, 19 Drawing Sheets

Related U.S. Application Data continuation of application No. PCT/IB2015/053179, filed on Apr. 30, 2015.

(51) Int. Cl.

| | | |
|---|---|---|
| *H01L 33/06* | (2010.01) | |
| *H01L 29/16* | (2006.01) | |
| *H01L 31/0304* | (2006.01) | |
| *H01L 31/0352* | (2006.01) | |
| *H01L 31/105* | (2006.01) | |
| *H01L 31/18* | (2006.01) | |
| *H01L 33/12* | (2010.01) | |
| *H01L 33/32* | (2010.01) | |
| *H01L 33/34* | (2010.01) | |

(52) U.S. Cl.
CPC .............. *H01L 31/03048* (2013.01); *H01L 31/035263* (2013.01); *H01L 31/105* (2013.01); *H01L 31/1848* (2013.01); *H01L 33/0012* (2013.01); *H01L 33/06* (2013.01); *H01L 33/12* (2013.01); *H01L 33/325* (2013.01); *H01L 33/343* (2013.01)

(58) Field of Classification Search
CPC ......... H01L 31/03044; H01L 31/03048; H01L 31/035263; H01L 31/105; H01L 31/1848; H01L 31/1856; H01L 33/0012; H01L 33/0075; H01L 33/12; H01L 33/325; H01L 33/343
USPC ........................................................ 257/13
See application file for complete search history.

(56) References Cited

U.S. PATENT DOCUMENTS

| | | |
|---|---|---|
| 5,060,030 A | 10/1991 | Hoke |
| 5,248,890 A | 9/1993 | Luth et al. |
| 5,932,899 A | 8/1999 | Schubert |
| 6,266,355 B1 | 7/2001 | Sverdlov |
| 6,546,034 B2 | 4/2003 | Komori et al. |
| 6,593,589 B1 | 7/2003 | Osinski et al. |
| 6,920,167 B2 | 7/2005 | Hoshi et al. |
| 6,921,924 B2 | 7/2005 | Tsai et al. |
| 6,958,497 B2 | 10/2005 | Emerson et al. |
| 6,995,389 B2 | 2/2006 | Kim et al. |
| 7,015,515 B2 | 3/2006 | Taki et al. |
| 7,148,519 B2 | 12/2006 | Wu et al. |
| 7,193,246 B1 | 3/2007 | Tanizawa et al. |
| 7,265,374 B2 | 9/2007 | Lee et al. |
| 7,498,182 B1* | 3/2009 | Sampath ............ B82Y 20/00 438/21 |
| 7,547,925 B2 | 6/2009 | Wong et al. |
| 7,566,580 B2 | 7/2009 | Keller et al. |
| 7,576,363 B2 | 8/2009 | Uemura et al. |
| 7,807,917 B2 | 10/2010 | Atanackovic |
| 7,825,418 B2 | 11/2010 | Chen |
| 7,901,994 B2 | 3/2011 | Saxler et al. |
| 7,910,935 B2 | 3/2011 | Seong |
| 8,000,366 B2 | 8/2011 | Bour et al. |
| 8,030,684 B2 | 10/2011 | Hu et al. |
| 8,088,637 B1 | 1/2012 | Wong et al. |
| 8,362,503 B2 | 1/2013 | Saxler et al. |
| 8,405,064 B2 | 3/2013 | Yamaguchi et al. |
| 8,421,107 B2 | 4/2013 | Shinohara et al. |
| 8,426,887 B2 | 4/2013 | Son |
| 8,507,357 B2 | 8/2013 | Lin et al. |
| 8,518,806 B2 | 8/2013 | Okuno et al. |
| 8,581,232 B2 | 11/2013 | Kim |
| 8,592,841 B2 | 11/2013 | Nakamura et al. |
| 8,633,468 B2 | 1/2014 | Gaska et al. |
| 9,240,517 B2 | 1/2016 | Johnston et al. |
| 9,240,533 B2 | 1/2016 | Lee et al. |
| 9,246,311 B1 | 1/2016 | Raring et al. |
| 9,252,329 B2 | 2/2016 | Northrup et al. |
| 9,269,788 B2 | 2/2016 | Gaska et al. |
| 9,281,439 B2 | 3/2016 | Niwa et al. |
| 9,281,441 B2 | 3/2016 | Shur et al. |
| 9,281,445 B2 | 3/2016 | Donofrio |
| 9,287,442 B2 | 3/2016 | Shatalov et al. |
| 9,287,449 B2 | 3/2016 | Gaska et al. |
| 9,287,455 B2 | 3/2016 | Shur et al. |
| 9,293,670 B2 | 3/2016 | Toita et al. |
| 9,299,880 B2 | 3/2016 | Grandusky et al. |
| 9,312,428 B2 | 4/2016 | Shatalov et al. |
| 9,312,448 B2 | 4/2016 | Lunev et al. |
| 9,318,650 B2 | 4/2016 | Zhang |
| 9,318,652 B1 | 4/2016 | Liao et al. |
| 9,330,906 B2 | 5/2016 | Shatalov et al. |
| 9,331,240 B2 | 5/2016 | Khan et al. |
| 9,331,244 B2 | 5/2016 | Shatalov et al. |
| 9,331,246 B2 | 5/2016 | Kneissl et al. |
| 9,337,387 B2 | 5/2016 | Shatalov et al. |
| 9,356,192 B2 | 5/2016 | Pernot et al. |
| 9,368,580 B2 | 6/2016 | Shatalov et al. |
| 9,368,582 B2 | 6/2016 | Kizilyalli et al. |
| 9,385,271 B2 | 7/2016 | Shur et al. |
| 9,397,260 B2 | 7/2016 | Jain et al. |
| 9,397,269 B2 | 7/2016 | Chae et al. |
| 9,401,452 B2 | 7/2016 | Northrup et al. |
| 9,401,456 B2 | 7/2016 | Lee et al. |
| 9,412,901 B2 | 8/2016 | Shur et al. |
| 9,412,902 B2 | 8/2016 | Shatalov et al. |
| 9,412,922 B2 | 8/2016 | Jang et al. |
| 9,437,430 B2 | 9/2016 | Schowalter et al. |
| 9,437,774 B2 | 9/2016 | Gaska et al. |
| 9,437,775 B2 | 9/2016 | Takeuchi et al. |
| 9,444,224 B2 | 9/2016 | Chua et al. |
| 9,450,157 B2 | 9/2016 | Yamada et al. |
| 9,455,300 B1 | 9/2016 | Collins et al. |
| 9,461,198 B2 | 10/2016 | Liao et al. |
| 9,466,761 B2 | 10/2016 | Choi et al. |
| 9,468,695 B2 | 10/2016 | Liao et al. |
| 9,496,455 B2 | 11/2016 | Park et al. |
| 9,502,509 B2 | 11/2016 | Shatalov et al. |
| 9,502,606 B2 | 11/2016 | Pernot et al. |
| 2002/0149033 A1 | 10/2002 | Wojtowicz |
| 2003/0205711 A1 | 11/2003 | Tanizawa et al. |
| 2004/0004223 A1 | 1/2004 | Nagahama et al. |
| 2005/0029506 A1 | 2/2005 | Lee et al. |
| 2005/0104088 A1 | 5/2005 | Niwa |
| 2005/0156183 A1 | 7/2005 | Tsai et al. |
| 2006/0108603 A1 | 5/2006 | Uemura et al. |
| 2007/0158640 A1* | 7/2007 | Halilov ............... B82Y 10/00 257/18 |
| 2008/0002750 A1 | 1/2008 | Onishi et al. |
| 2008/0054248 A1 | 3/2008 | Chua et al. |
| 2008/0112452 A1 | 5/2008 | Chakraborty et al. |
| 2008/0295879 A1 | 12/2008 | Atanackovic |
| 2009/0045392 A1 | 2/2009 | Park et al. |
| 2009/0194784 A1 | 8/2009 | Kaji et al. |
| 2010/0213436 A1 | 8/2010 | Khan |
| 2010/0276710 A1 | 11/2010 | Sampath et al. |
| 2011/0180778 A1 | 7/2011 | Lin et al. |
| 2011/0193063 A1 | 8/2011 | Mears et al. |
| 2011/0235665 A1 | 9/2011 | Simon et al. |
| 2012/0037881 A1 | 2/2012 | Kim et al. |
| 2012/0068152 A1 | 3/2012 | Hwang et al. |
| 2012/0091435 A1 | 4/2012 | Ikuta et al. |
| 2012/0104360 A1 | 5/2012 | Hardy et al. |
| 2012/0145991 A1 | 6/2012 | Nam et al. |
| 2012/0175589 A1 | 7/2012 | Ooshika et al. |
| 2012/0201264 A1 | 8/2012 | Shatalov et al. |
| 2012/0313076 A1 | 12/2012 | Nakamura et al. |
| 2012/0313077 A1 | 12/2012 | Nakamura et al. |
| 2013/0026480 A1 | 1/2013 | Fenwick et al. |
| 2013/0026482 A1 | 1/2013 | Fenwick |
| 2013/0043458 A1 | 2/2013 | Chen et al. |
| 2013/0048939 A1 | 2/2013 | Zhang et al. |
| 2013/0082274 A1 | 4/2013 | Yang et al. |
| 2013/0221320 A1 | 8/2013 | Li et al. |
| 2013/0285065 A1 | 10/2013 | Zhu et al. |

(56) References Cited

U.S. PATENT DOCUMENTS

| | | | |
|---|---|---|---|
| 2013/0299778 A1* | 11/2013 | Okuno | H01L 33/04 257/13 |
| 2013/0320296 A1 | 12/2013 | Yu et al. | |
| 2014/0024159 A1 | 1/2014 | Jain | |
| 2014/0084241 A1 | 3/2014 | Okuno et al. | |
| 2016/0149074 A1 | 5/2016 | Atanackovic et al. | |
| 2016/0163920 A1 | 6/2016 | Atanackovic | |

FOREIGN PATENT DOCUMENTS

| | | |
|---|---|---|
| CN | 102569484 A | 7/2012 |
| CN | 103682002 A | 3/2014 |
| CN | 102945902 B | 12/2014 |
| EP | 1065705 A2 | 1/2001 |
| EP | 1301947 B1 | 9/2007 |
| EP | 2037509 A1 | 3/2009 |
| EP | 2362437 A1 | 8/2011 |
| JP | S6027692 A | 2/1985 |
| JP | 2002540618 A | 11/2002 |
| JP | 2006261688 A | 9/2006 |
| JP | 2010021576 A | 1/2010 |
| JP | 2010287882 A | 12/2010 |
| JP | 2012164749 | 8/2012 |
| JP | 2005150531 A | 6/2015 |
| KR | 1020080060053 A | 7/2008 |
| TW | 201320390 A1 | 5/2013 |
| WO | 2004008552 A2 | 1/2004 |
| WO | 2012067687 A2 | 5/2012 |
| WO | 2013096821 A1 | 6/2013 |

OTHER PUBLICATIONS

Chiou et at., The Effect of the Intrinsic Layer on Reliability of Nitride-based p-i-n Photodetectors, Optical Fiber Communication & Optoelectronic Exposition & Conference, 2008. AOE 2008. Asia, Oct. 2008, pp. 1-3.

III-Nitride Based Optoelectronics, Final Report, Northwestern University, Jan. 2010, 64 pages.

International Search Report and Written Opinion dated Aug. 13, 2015 for PCT Patent Application No. PCT/IB2015/053179.

International Search Report and Written Opinion dated Jul. 23, 2015 for PCT Patent Application No. PCT/IB2015/053203.

International Search Report and Written Opinion dated Jul. 9, 2015 for PCT Patent Application No. PCT/IB2015/052480.

Jawagi, Study of Analytical Determination of Parasitic Resistances in Gallium Nitride (GaN) MESFETs, California State University, Northridge, May 2012, 78 pages.

Jena et al., Polarization-Engineering in III-V Nitride Heterostructures: New Opportunities for Device Design, Dec. 3, 2011, Phys. Status Solidi A, 208: 1511-1516, pp. 1-7.

Katsumasa et al., Structural Design of AlN/GaN Superlattices for Deep-Ultraviolet Light-Emitting Diodes with High Emission Efficiency, Applied Physics Letters 99, 151108, Oct. 2011, 3 pages.

Kipshidze, et al., AlN/AlGaInN superlaffice light-emitting diodes at 280 nm, J. Appl. Phys. 93(3), Feb. 2003, pp. 1363-6.

Nikishin et al., Deep Ultraviolet Light Emitting Diodes Based on Short Period Superlattices of AlN/AlGa(In)N, Jpn. J. Appl. Phys. 42, Nov. 2003, pp. L 1362-L 1365.

Nikishin et al., Digital Alloys of AlN/AlGaN for Deep UV Light Emitting Diodes, Jpn. J. Appl. Phys. 44(10), Oct. 2005, pp. 7221-6.

Notice of Allowance dated Feb. 21, 2017 for U.S. Appl. No. 14/976,208.

Notice of Allowance dated Mar. 1, 2017 for U.S. Appl. No. 14/976,337.

Office Action dated Jun. 9, 2016 for U.S. Appl. No. 14/976,208.

Office Action dated Nov. 3, 2016 for U.S. Appl. No. 14/976,208.

Restriction Requirement dated Nov. 28, 2016 for U.S. Appl. No. 14/976,337.

Saengkaew, Epitaxial growth and properties of AlGaN-based UV-LEDs on Si(111) substrates, Mar. 2010, 227 pages.

Simon, Polarization-Engineered III-V Nitride Heterostructure Devices by Molecular Beam Epitaxy, University of Notre Dame, Apr. 2009, 140 pages.

Taniyasu et al, Aluminum Nitride Deep-Ultraviolet Light-Emitting Diodes, NTT Technical Review, Dec. 2006, vol. 4, No. 12, pp. 54-58.

Taniyasu et al., An aluminium nitride light-emitting diode with a wavelength of 210 nanometres, Nature 441, 325-328 May 18, 2006, pp. 1-6. Accessed on Aug. 22, 2013, file://S:\CJP\LETTERS.htm.

Wang, A Gadolinium Doped Superlattice GaN Schottky Diode for Neutron Detection, Transactions of the American Nuclear Society, vol. 104, Hollywood, Florida, Jun. 26-30, 2011.

Yoo, Growth and Characterization of III-Nitrides Materials System for Photonic and Electronic Devices by Metalorganic Chemical Vapor Deposition, Georgia Institute of Technology, Aug. 2007, 173 pages.

Notice of Allowance dated Sep. 18, 2017 for U.S. Appl. No. 15/601,890.

Chung, J.W., E.L. Piner, and T. Palacios, "N-Face GaN/AlGaN HEMTs Fabricated Through Layer Transfer Technology," Electron Device Letters, IEEE 30.2 (Feb. 2009): 113-116. © 2009 Institute of Electrical and Electronics Engineers.

Nath et al., "Molecular beam epitaxy of N-polar InGaN," Aug. 2010, Applied Physics Letters 97, Jul. 19, 2003.

Office Action dated Dec. 14, 2017 for U.S. Appl. No. 14/976,814.

Park et al, "Spontaneous polarization effects in wurtzite GaN/AlGaN quantum wells and comparison with experiment," Apr. 2000, Appl. Phys. Lett. 76, pp. 1981-1983.

Pereira et al., "Strain and composition distributions in wurtzite InGaN/GaN layers extracted from x-ray reciprocal space mapping," May 2002, Appl. Phys. Lett. 80, pp. 3913-3915.

Smith et al., "Determination of Wurtzite GaN Lattice Polarity Based on Surface Reconstruction", Feb. 1998, Appl. Phys. Lett., 72, 2114, pp. 1-7.

Office Action dated Jun. 25, 2018 for China Patent Application Serial No. 201580027680.9.

Office Action dated May 9, 2018 for People's Republic of China Patent Application No. 201580027679.6.

Wang et al., A Gadolinium Doped Superlattice GaN Schottky Diode for Neutron Detection, Innovation in Radiation Detectors: New Designs, Improvements, and Applications, Jun. 26-30, 2011, 209-210, vol. 104, Transactions of the American Nuclear Society, Hollywood, Florida.

Official Letter and Search report dated Aug. 2, 2018 for Taiwan Patent App. No. 104116463.

Official Letter and Search report dated Jul. 30, 2018 for Taiwan Patent App. No. 104116670.

Office Action dated Aug. 20, 2018 for Taiwan Patent Application Serial No. 104113397.

* cited by examiner

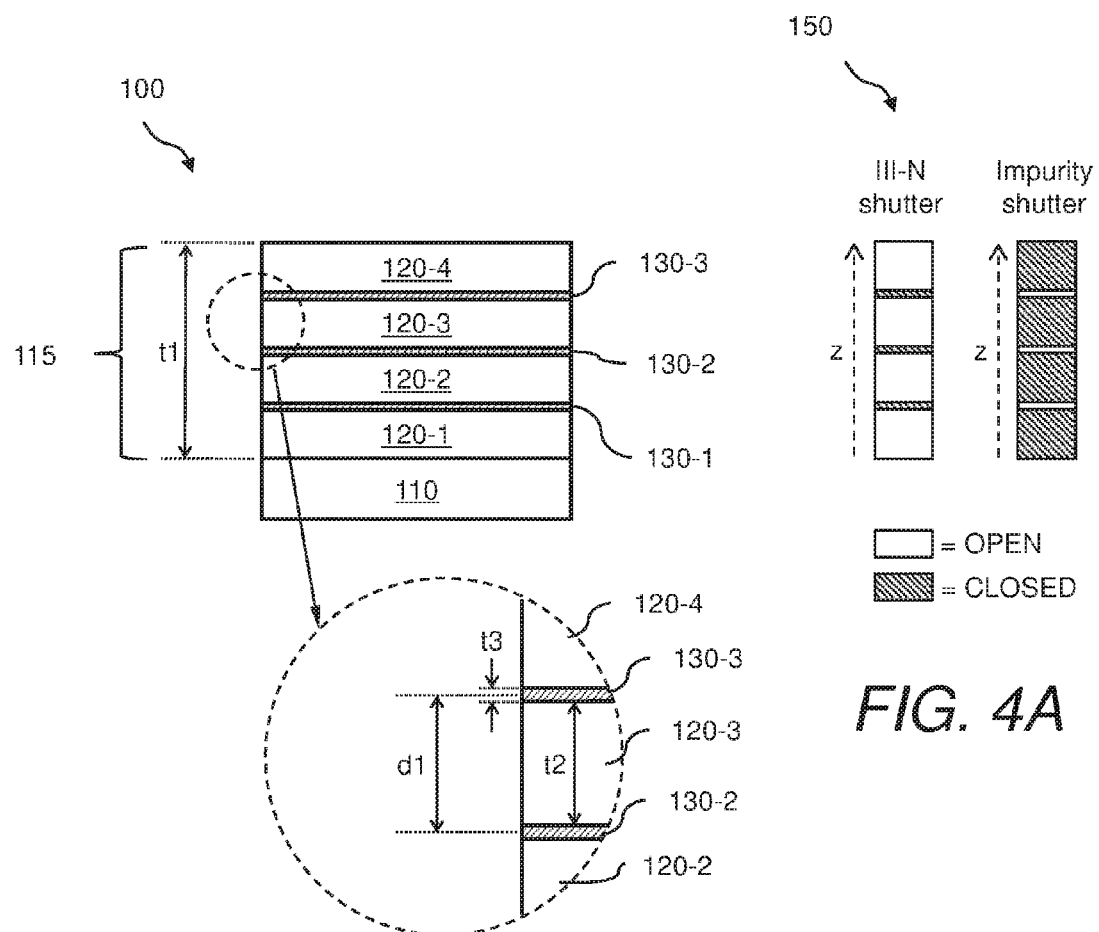

ELECTRONIC DEVICES COMPRISING N-TYPE AND P-TYPE SUPERLATTICES

CROSS-REFERENCE TO RELATED APPLICATION

This application is a divisional of U.S. patent application Ser. No. 14/976,208 filed Dec. 21, 2015, which is a continuation of International Patent Application number PCT/IB2015/053179, filed Apr. 30, 2015, which claims priority from Australian Provisional Patent Application number 2014902010 filed on May 27, 2014 and entitled "Electronic Devices Comprising N-type and P-type Superlattices" and Australian Provisional Patent Application number 2014902009 filed on May 27, 2014 and entitled "N-type and P-type Superlattices and Fabrication Thereof" all of which are incorporated herein by reference in their entirety.

FIELD OF THE INVENTION

The present invention relates to semiconductors, electronic devices and fabrication thereof. In particular, the present invention relates to altering the electrical and optical properties of semiconductors.

BACKGROUND TO THE INVENTION

In semiconductor fabrication processes, the electrical properties of a semiconductor material, such as conductivity type, may be changed. Typically, semiconductors can be doped with a donor impurity to change their conductivity to n-type where there is an excess of electrons or doped with an acceptor impurity to change their conductivity to p-type where there is an excess of holes.

A semiconductor is considered a wide bandgap semiconductor when it has an electronic bandgap EG that is significantly larger than three electron volts (i.e., $E_G \geq 3$ eV). Wide bandgap semiconductors formed from group III metal nitride materials, such as aluminum nitride (AlN) or aluminum-gallium nitride ($Al_xGa_{1-x}N$), are also known as refractory materials due to their high formation temperatures. It is to be understood the term group III metal refers to atoms selected from the boron group of the periodic table of elements. Of particular interest are the group III metal nitride materials, which can be typically doped with a donor impurity specie, such as a group-IV atom specie (e.g. silicon (Si)), to change the conductivity to n-type. Conversely, group III metal nitrides are doped with an acceptor impurity, such as a group-II atom specie (e.g., magnesium (Mg)), to change the conductivity to p-type. Semiconductors formed from group III metal nitride materials are used in the fabrication of electronic devices, such as high power transistors, and optical devices, such as light-emitting diodes (LEDs).

One problem with using group III metal nitride materials in devices, is that in conventional device-fabrication processes, it is difficult to achieve a high level of activated doping density in group III metal nitride materials that have a relatively high aluminum (Al) content, such as $Al_xGa_{1-x}N$, where x is greater than about 0.5. It is further found that electronic grade levels of activated p-type doping ($N_A \geq 10^{18}$ cm$^{-3}$) are particularly difficult to obtain in all group III metal nitride semiconductors, which is exacerbated for high Al % films. High Al % films of $Al_xGa_{1-x}N$ and $Al_yIn_{1-y}N$ for the case of $x \geq 0.6$ and $y \geq 0.7$, respectively, suffer a transition in the energy ordering of the valence bands in the vicinity of the crystal momentum zone center (i.e., in the vicinity of the direct gap). This further complicates the achievement of high levels of activated holes for electronic and optoelectronic devices.

Co-deposition techniques are typically used to incorporate a selected dopant impurity into a bulk $Al_xGa_{1-x}N$ material. However, these techniques often do not achieve the desired activated doping densities. Dopant impurities co-deposited during the epitaxial formation of a bulk group III nitride film tend to either segregate to the surface of the growing film or are not readily incorporated into substitutional metal lattice sites of the group III metal nitride crystal structure. Consequently, the impurity dopants are not optimally incorporated into the host group III metal nitride material. It is found experimentally, in order to achieve sufficient electrically activated dopant concentrations in group III metal nitride films, adding relatively high levels of impurity atom dopants during epitaxial layer formation, is required to compensate for the poor incorporation of the said impurity dopants—typically exceeding the solubility limit. There is yet a further fundamental trade-off in achieving simultaneously the goals of (i) high electrically activated dopant concentrations and (ii) high quality crystal structure films. That is, high incident fluxes of dopant species during co-deposition are required to incorporate at least a portion (typically ~1-10%) of the available impurity atoms into the growing group III metal nitride film, which comes at the disadvantageous expense of reduced structural quality of the resulting group III metal nitride film.

There is yet a further fundamental limitation of conventional impurity atom doping in wide band gap semiconductors, and particularly for group III metal nitride semiconductors. Even if ideal substitutional doping of a group III metal site within the host crystal is achieved, the activation energy of the donor or acceptor $E_{act}(D,A)$ is generally large, and thus at room temperature only a small portion of the available excess carriers are activated within the host.

Light emitting devices are typically based on the quantum mechanical recombination of opposite carrier types, namely electrons and holes, within a given spatial region of a fixed bandgap semiconductor material. The optical bandgap defining the said recombination region controls the emitted optical energy of a photon created by the conversion of energy of the electron and hole. The supply of electrons and holes are provided by p-type and n-type reservoirs and typically configured in the layered structure of a PIN diode. The PIN diode comprises a p-type layer (hole reservoir), an intrinsic layer and an n-type layer (electron reservoir). The recombination process occurs substantially within the intrinsic region and is generally formed as a not intentionally doped (NID) semiconductor. By appropriate electrical bias, electrons and holes are simultaneously injected into the intrinsic layer of the PIN diode. It is understood that PN junction diodes can also be used.

Furthermore, when group III metal nitride materials are used in conventional fabrication of ultraviolet (UV) LEDs, the UV LEDs are constructed using multiple layers of dissimilar compositions of selected group III metal nitrides forming so called heterostructures. In heterostructure UV PIN or PN LEDs, a wider bandgap group III metal nitride material is used to form at least one of a p-type region and an n-type region of the LED, and a narrower bandgap group III metal nitride material is used to form an active recombination region of the LED. The wider bandgap region is required so as to provide a low absorption coupling external to the device. That is, the photogenerated light must be able to escape from the internal region of the LED.

One problem with heterostructure UV LEDs, is that at any group III metal nitride heterojunction, for example, the interface between the wider bandgap and narrower bandgap group III metal nitride material, creates extremely large internal polarization fields, (such as spontaneous polarization fields and piezoelectric fields). These internal polarization fields interfere with the distribution and transport of charge carriers, such as electrons and holes, within the active region of the LED, and consequently the recombination of carriers is substantially reduced by the extremely large internal electric polarization fields which tend to inhibit the ideal spatial localization of electron and holes. In fact, the built in electric polarization fields tend to spatially separate the electron and hole wavefunctions in the recombination region. That is, the electronic spatial probability distributions (known by workers in the field as quantum mechanical wavefunctions) of the electrons and holes are not aligned and thus the so-called overlap integral is severely diminished and thus recombination is substantially reduced. The amount of light emitted from the LED is therefore substantially reduced compared to the equivalent case where internal electric polarization fields do not exist.

SUMMARY OF THE INVENTION

There is a pressing need to overcome the aforementioned limitation in conventional group III metal nitride light emitting devices. New approaches are needed for providing the desired conductivity type in group III metal nitride semiconductor materials having high Al-content such that the level of the impurity activation is high (i.e., $N_{A,D} > 10^{18}$ cm$^{-3}$) and new approaches are needed for enhancing light emission efficiency in UV LEDs.

In one form, although it need not be the only or indeed the broadest form, the invention resides in a superlattice. In particular, an engineered layered single crystal structure forming a superlattice. The superlattice provides p-type or n-type conductivity, and comprises alternating host layers and impurity layers, wherein:
the host layers consist essentially of a semiconductor material; and
the impurity layers consist essentially of a corresponding donor or acceptor material.

Preferably, the semiconductor material is a group III metal nitride semiconductor material.

Suitably, a plurality of the impurity layers are donor impurity layers consisting essentially of a donor material and a plurality of the impurity layers are acceptor impurity layers consisting essentially of an acceptor material.

Suitably, the impurity layers alternate between donor impurity layers and acceptor impurity layers.

In another form, although it need not be the broadest form, the invention resides in an electronic device comprising:
a n-type superlattice providing n-type conductivity; and
a p-type superlattice providing p-type conductivity;
the n-type superlattice comprising alternating host layers and donor impurity layers, wherein:
the host layers consist essentially of a group III metal nitride semiconductor material; and
the donor impurity layers consist essentially of a corresponding donor material;
the p-type superlattice comprising alternating host layers and acceptor impurity layers, wherein:
the host layers consist essentially of the group III metal nitride semiconductor material; and
the acceptor impurity layers consist essentially of a corresponding acceptor material.

Preferably, the electronic device is an ultraviolet light emitting diode or an ultraviolet light detector.

Suitably, the n-type superlattice and the p-type superlattice form a PN junction.

Suitably, electronic device further comprises an intrinsic region between the n-type superlattice and the p-type superlattice to form a PIN junction.

Suitably, the superlattice forms a layered PIN diode.

Suitably, the intrinsic region consists essentially of one or more group III metal nitride semiconductor materials.

Suitably, the intrinsic region has a bandgap that varies along a growth direction.

Suitably, the intrinsic region comprises at least one of the following: a pure group III metal nitride semiconductor material; a group III metal nitride semiconductor material including at least one crystal structure modifier, wherein the crystal structure modifier is selected from at least one of hydrogen (H), oxygen (O), carbon (C), rare-earth or lanthanide metal; and a not-intentionally doped (NID) group III metal nitride semiconductor material.

Suitably, a period and/or a duty cycle of the p-type superlattice and/or the n-type superlattice is such that the p-type superlattice and/or the n-type superlattice is transparent to a photon emission wavelength or a photon absorption wavelength of the intrinsic region.

Preferably, the electronic device further comprises a buffer region adjacent the n-type superlattice, the buffer region consisting essentially of AlN and/or GaN.

Suitably, the buffer region has a thickness of between about 1 nm to about 1 μm.

Suitably, the buffer region has a thickness of between 10 nm and about 1 μm, or more, preferably between 100 nm and 500 nm.

Suitably, the buffer region comprises a superlattice comprising alternating layers of AlN and GaN with a bulk composition equivalent to the group III metal nitride semiconductor material.

Suitably, the buffer region comprises a ternary bulk alloy composition of at least one of group III metal nitride semiconductor material with composition $Al_xGa_{1-x}N$, $0 \leq x \leq 1$.

Suitably, the buffer region comprises a group III metal oxide of the form of: $(A_xB_{1-x})_2O_3$, where A and B are selected from at least two of Al, In and Ga.

Preferably, the electronic device further comprises a substrate.

Preferably, a material for the substrate is selected from one of: a native group III metal nitride material, such as AlN or GaN, a metal oxide material, such as sapphire, magnesium oxide (MgO) or zinc-oxide (ZnO), silicon (Si), silicon-carbide (SiC), Calcium Fluoride (CaF$_2$), a crystalline thin film semiconductor on amorphous glass, or a thin film crystalline semiconductor on metal.

Suitably, the electronic device comprises a buffer region between the n-type superlattice and the substrate.

Suitably, the electronic device comprises a buffer region between the p-type superlattice and the substrate.

Suitably, electronic device further comprises a p-type contact layer adjacent the p-type superlattice and a p-type contact formed on the p-type contact layer.

Suitably, the p-type contact is substantially reflective to an emission wavelength of the electronic device.

Suitably, the p-type contact comprises one or more windows or openings to enable light to leave the electronic device.

Suitably, the electronic device further comprises an n-type contact formed adjacent the n-type superlattice.

Suitably, the electronic device of further comprises an ohmic contact layer adjacent the substrate.

Suitably, the substrate and the ohmic contact layer comprise one or more windows or openings to enable light to leave the electronic device.

Suitably, the electronic device further comprises a passivation layer adjacent and perpendicular to the p-type superlattice and the n-type superlattice to isolate a conduction path.

Suitably, the passivation layer consists of a wide band gap material having a wider band gap than the group III metal nitride semiconductor material of the host layer.

Suitably, the passivation layer consists essentially of $Al_xO_y$, where $0<x\leq2$ and $0<y\leq3$.

Suitably, the n-type superlattice and/or the p-type superlattice is tensile strained or compressively strained.

Suitably, the n-type superlattice and/or the p-type superlattice has an electron wavefunction and a hole wavefunction, and peaks of the electron wavefunction are not spatially aligned with peaks of the hole wavefunction.

Suitably, the p-type superlattice and the n-type superlattice each comprise at least 10 host layers and at least 10 donor impurity layers or acceptor impurity layers.

Suitably, a period of the p-type superlattice and/or a period of the n-type superlattice is uniform.

Suitably, a period of the p-type superlattice and/or a period of the n-type superlattice is non-uniform.

Suitably, the host layers comprise non-intentionally doped group III metal nitride semiconductor material.

In another form, although it need not be the broadest form, the invention resides in a method of making a p-type or n-type superlattice via a film formation process, the method comprising the steps of:
a. loading a substrate into a reaction chamber;
b. heating the substrate to a film formation temperature;
c. forming on the substrate a host layer consisting essentially of a group III metal nitride semiconductor material;
d. forming a first nitrogen terminated surface on the host layer;
e. forming on the first nitrogen terminated surface an impurity layer consisting essentially of a corresponding donor or acceptor material;
f. forming on the impurity layer a nitrogen layer to form a second nitrogen terminated surface;
g. forming on the second nitrogen terminated surface a host layer consisting essentially of the group III metal nitride semiconductor material;
h. repeating steps (d) to (g) until the superlattice reaches a desired thickness or comprises a desired number of layers.

Suitably, the desired number of layers is at least 10 host layers and at least 10 impurity layers.

Preferably, the film formation process is a vacuum deposition process, a molecular beam epitaxy process or a vapour phase deposition process.

Suitably, the film formation temperature is between about 200° C. and about 1200° C.

Suitably, the film formation temperature is between about 500° C. and about 850° C.

Suitably, the desired thickness of the superlattice is between about 50 nm and about 5 μm.

Suitably, the reaction chamber is sufficiently deficient of hydrogen (H), oxygen (O) and carbon (C) species so as to not impact the electronic or structural quality of the superlattice.

Suitably, the method comprises growth interruptions for nitrogen terminated surface preparation using excited molecular nitrogen species Suitably, the host layers and the impurity layers have a predetermined crystal polarity.

Suitably, the predetermined crystal polarity is a substantially metal polar polarity or a nitrogen polarity along a growth direction.

Suitably, the group III metal in the group III metal nitride semiconductor material comprises at least about 50% Al by mol.

Suitably, the semiconductor material or group III metal nitride semiconductor material is selected from at least one of: aluminium nitride (AlN); aluminium gallium nitride ($Al_xGa_{1-x}N$) where $0<x<1$; aluminium indium nitride (AlxIn1−xN) where $0<x<1$; and aluminium gallium indium nitride ($Al_xGa_yIn_{1-x-y}N$) where $0<x<1$, $0<y<1$ and $x+y<1$.

Suitably, the donor material is selected from at least one of: silicon (Si); germanium (Ge); silicon-germanium ($Si_xGe_{1-x}$) where $0<x<1$; crystalline silicon-nitride ($Si_xN_y$) where $0<x<3$ and $0<y<4$; crystalline germanium-nitride ($Ge_xN_y$) where $0<x<3$ and $0<y<4$; crystalline silicon-aluminium-gallium-nitride ($Si_u[Al_xGa_{1-y}]_zN_v$) where $u>0$, $x>0$, $0<y<1$, $z>0$ and $v>0$; and crystalline germanium-aluminium-gallium-nitride ($Ge_u[Al_xGa_{1-y}]_zN_v$) where $u>0$, $x>0$, $0<y<1$, $z>0$ and $v>0$.

Suitably, the acceptor material is selected from at least one of: magnesium (Mg); zinc (Zn); carbon (C); crystalline magnesium-nitride ($Mg_xN_y$) where $x>0$ and $y>0$; crystalline zinc-nitride ($Zn_xN_y$) where $x>0$ and $y>0$; magnesium-aluminium-gallium-nitride ($Mg_u[Al_xGa_{1-y}]_zN_v$) where $u>0$, $x>0$, $0<y<1$, $z>0$ and $v>0$; and zinc-aluminium-gallium-nitride ($Zn_u[Al_xGa_{1-y}]_zN_v$) where $u>0$, $x>0$, $0<y<1$, $z>0$ and $v>0$.

Suitably, the donor material or the acceptor material comprises one or more of the atomic species in the Lanthanide series of the periodic table of elements.

Suitably, the donor material or the acceptor material comprises a majority of gadolinium (Gd).

Suitably, the donor material or the acceptor material is selected from crystalline lanthanide-nitride composition with formula $L_xN_y$, where L is at least one species of Lanthanide atom and N is nitrogen, where $0<x<3$ and $0<y\leq2$.

Suitably, the donor material or the acceptor material is a Gadolinium-nitride $Gd_xN_y$, where $0<x\leq3$ and $0<y\leq2$.

Preferably, the superlattice comprises at least 10 host layers and at least 10 impurity layers.

Suitably, the host layers have a similar thickness to one another and/or the impurity layers have a similar thickness to one another.

Suitably, subsequent host layers have a substantially different thickness and/or subsequent impurity layers have a substantially different thickness.

Suitably, the host layers each have a thickness of between about 1 nm and about 25 nm.

Suitably, the host layers each have a thickness of at least one half of a monolayer and at most 10 monolayers.

Suitably, the impurity layers each have a thickness of between about 0.25 nm and about 2 nm.

Suitably, the impurity layers each have a thickness of at least one half of a monolayer and less than five monolayers.

Suitably, the impurity layers each have a thickness of at least one monolayer and less than or equal to two monolayers.

Suitably, each donor impurity layer and/or each acceptor impurity layer is a monolayer of atoms of the donor material or the acceptor material.

Suitably, the impurity layers each form a hexagonal crystal mesh and the host layers have a wurtzite crystal structure.

Suitably, the semiconductor material is silicene or graphene.

Suitably, the average spacing between atoms of the donor material or the acceptor material in the plane of the impurity layer is less than 1 nm.

Suitably, the average spacing between atoms of the donor material or the acceptor material in the plane of the impurity layer is about 0.1 nm.

Suitably, subsequent impurity layers are separated by a distance such that the electron and/or hole wavefunctions in the electronic potential wells induced by the atoms of the donor material or acceptor material spatially overlap.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

FIG. 1 is a cross-sectional view of a superlattice, according to an embodiment of the present invention.

FIG. 4A is a schematic of a shutter modulation sequence for forming the superlattice shown in FIG. 1.

Figure 2A:
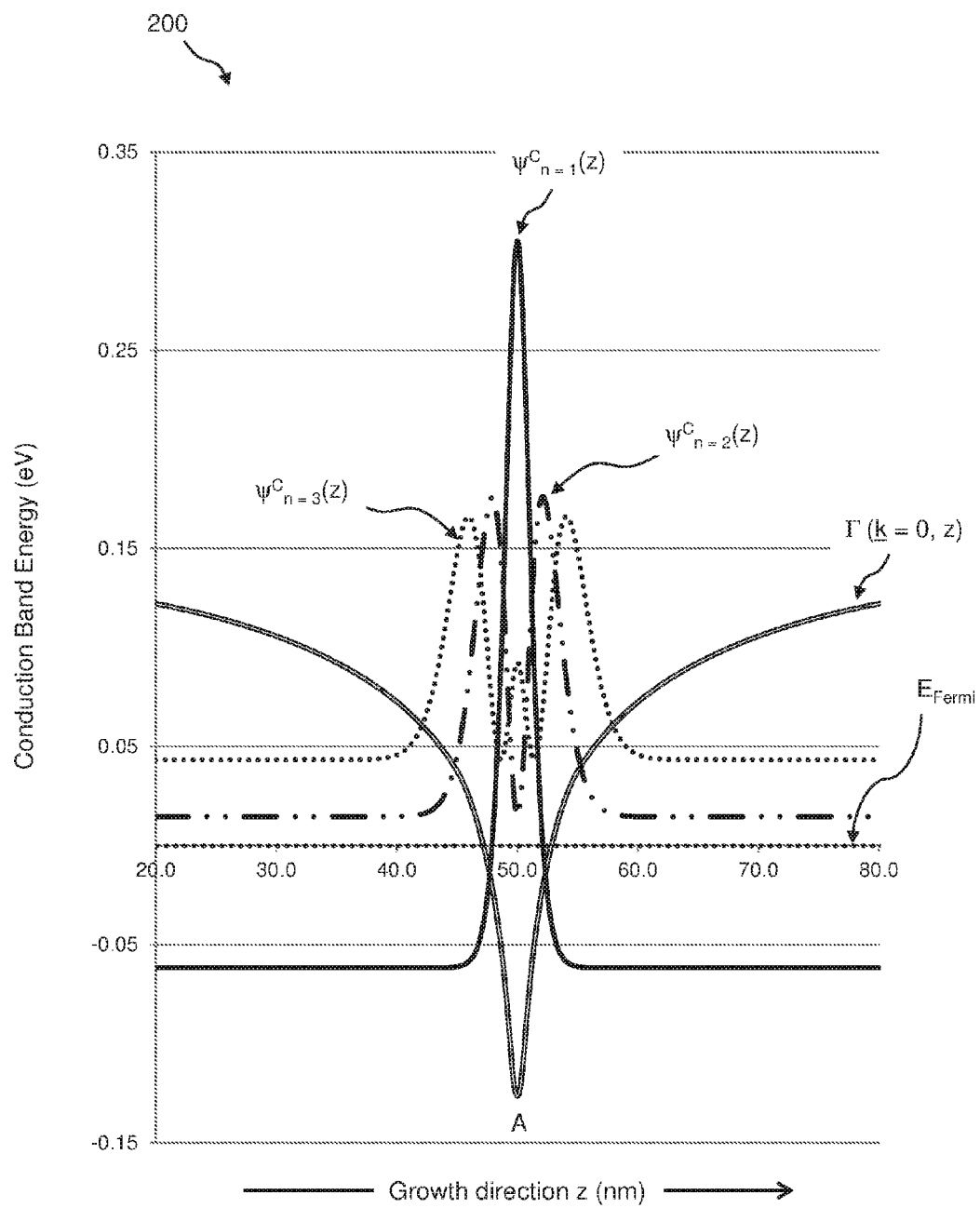
FIG. 2A is an energy-band diagram of the lowest conduction band $\Gamma$ (k=0, z) in a superlattice comprising a single donor impurity layer.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The superlattice, electronic device and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION OF THE INVENTION

A Superlattice

According to one aspect, the invention resides in a superlattice providing p-type or n-type conductivity. The superlattice comprises alternating host layers and impurity layers. The host layers consist essentially of a semiconductor material, and the impurity layers consist essentially of a corresponding donor or acceptor material. For example, the host layers are formed of a not intentionally doped (NID) semiconductor material and the impurity layers are formed of one or more corresponding donor or acceptor materials. The superlattice can be formed via a film formation process as described further below with reference to FIGS. 4 and 4A. In preferred embodiments, the superlattice is formed as a layered single crystal structure. In preferred embodiments, the superlattice is a short-period superlattice.

The superlattice can be considered to comprise a plurality of unit cells, each consisting of a host layer and an impurity layer. However, in alternative embodiments, the unit cells can comprise a host layer and two or more impurity layers. The electrical and optical properties of the superlattice can be changed by varying the period and the duty cycle of the unit cells. In preferred embodiments, the superlattice comprises unit cells having uniform periodicity. However, in alternative embodiments, the superlattice comprises unit cells having non-uniform periodicity. For example, the period is varied linearly along the superlattice by varying the thickness of the host layers and/or impurity layers.

The period of the superlattice is defined as the center-to-center spacing between adjacent impurity layers or impurity layers in adjacent unit cells. The duty cycle of each unit cell is defined as the ratio of the thickness of the host layer to the thickness of the impurity layer in the unit cell.

In preferred embodiments, the semiconductor material is a group III metal nitride semiconductor material. Particularly, the semiconductor material is a group III metal nitride semiconductor material wherein the group III metal in the group III metal nitride semiconductor material comprises at least about 50% Al by mol.

The superlattice exhibits several advantages over semiconductor materials doped via conventional methods. The superlattice obviates the need to co-deposit a dopant impurity during formation of the semiconductor material and substantially reduces or entirely eliminates the prior art problem of segregation of dopant impurities to the surface of the semiconductor material during the film formation process. The superlattice can also provide a relatively large excess of free carriers.

Where the host layers consist essentially of a group III metal nitride semiconductor material that has a high Al content, the superlattice achieves a high level of n-type or p-type conductivity and the activated carrier concentration does not significantly decrease with increasing Al content. Hence, the present invention can provide highly activated n-type or p-type conductivity in a group III metal nitride semiconductor with a high Al content.

FIG. 1 is a cross-sectional view of a structure 100 comprising a substrate 110 and a superlattice 115, according to an embodiment of the present invention. The superlattice 115 is formed atop the substrate 110. In one embodiment, a material for the substrate 110 is an aluminium oxide, such as sapphire, in a c-plane orientation and the substrate 110 has a thickness of about 600 µm. However, other suitable substrate materials or substrate thicknesses can be used. For example, the material for the substrate can be selected from one of a native group III metal nitride material, such as AlN or GaN, another metal oxide material, such as magnesium oxide (MgO) or zinc-oxide (ZnO), silicon (Si), silicon-carbide (SiC), Calcium Fluoride (CaF$_2$), a crystalline thin film semiconductor on amorphous glass, or a thin film crystalline semiconductor on metal.

The superlattice 115 comprises alternately formed host layers 120-n and impurity layers 130-n. As shown in the example in FIG. 1, in order, the superlattice 115 comprises host layer 120-1, impurity layer 130-1, host layer 120-2, impurity layer 130-2, host layer 120-3, impurity layer 130-3, and host layer 120-4. Each pair comprising a host layer 120-n and an adjacent impurity layer 130-n constitutes a unit cell. For example, the host layer 120-1 and the impurity layer 130-1 together constitute a unit cell.

In the embodiment shown in FIG. 1, four of the host layers 120-n and three of the impurity layers 130-n (i.e., three and one-half unit cells) are shown, but any number of the alternating host layers 120-n and impurity layers 130-n may be formed to create the superlattice 115 with a thickness t1. For example, in preferred embodiments, superlattice 115 comprises at least 10 unit cells and can comprise hundreds or thousands of unit cells. The thickness t1 of the superlattice 115 is between about 50 nm and about 5 µm. In preferred embodiments, the thickness t1 is about 250 nm.

With reference to the enlarged section shown in FIG. 1, each of the host layers 120-n has a thickness t2. In preferred embodiments, the thickness t2 is between about 1 nm and about 25 nm. In some embodiments, the host layers each have a thickness of at least one half of a monolayer and at most 10 monolayers. Each of the impurity layers 130-n has a thickness t3. In preferred embodiments, the thickness t3 is between about 0.25 nm and about 2 nm. In some embodiments, the thickness t3 is about 1 nm. In some embodiments, the impurity layers 130-n each have a thickness of at least one half of a monolayer and less than five monolayers. In some embodiments, the impurity layers 130-n each have a thickness of at least one monolayer and less than or equal to two monolayers. In preferred embodiments, the average spacing between atoms of the donor material or acceptor material in the plane of the impurity layer is less than 1 nm and more preferably about 0.1 nm.

In preferred embodiments, the host layers 120-n consist essentially of a Group III metal nitride semiconductor material. A Group III metal nitride semiconductor material consists of one or more Group III metals and nitrogen. For example, the semiconductor material can be selected from at least one of: aluminium nitride (AlN); aluminium gallium nitride ($Al_xGa_{1-x}N$) where $0<x<1$; aluminium indium nitride ($Al_xIn_{1-x}N$) where $0<x<1$; aluminium gallium indium nitride ($Al_xGa_yIn_{1-x-y}N$) where $0<x<1$, $0<y<1$ and $x+y<1$. In preferred embodiments, the one or more Group III metals comprise at least about 50% Al by mol.

In preferred embodiments, the impurity layers 130-n consist essentially of a donor material corresponding to the Group III metal nitride semiconductor material or an acceptor material corresponding to the Group III metal nitride semiconductor material. However, in some alternative embodiments, a plurality of the impurity layers are donor impurity layers consisting essentially of a donor material corresponding to the semiconductor material and a plurality of the impurity layers are acceptor impurity layers consisting essentially of an acceptor material corresponding to the semiconductor material. For example, impurity layers can alternate between donor impurity layers and acceptor impurity layers.

Where the impurity layers 130-n consist essentially of the donor material, the superlattice provides n-type conductivity. For example, the donor material can be selected from at least one of: silicon (Si); germanium (Ge); silicon-germanium ($Si_xGe_{1-x}$) where $0<x<1$; crystalline silicon-nitride ($Si_xN_y$) where $0<x<3$ and $0<y<4$; crystalline germanium-nitride ($Ge_xN_y$) where $0<x<3$ and $0<y<4$; crystalline silicon-aluminium-gallium-nitride ($Si_u[Al_xGa_{1-y}]_zN_v$) where $u>0$, $x>0$, $0<y<1$, $z>0$ and $v>0$; and crystalline germanium-aluminium-gallium-nitride ($Ge_u[Al_xGa_{1-y}]_zN_v$) where $u>0$, $x>0$, $0<y<1$, $z>0$ and $v>0$.

Where the impurity layers 130-n consist essentially of the acceptor material, the superlattice provides p-type conductivity. For example, the acceptor material can be selected from at least one of: magnesium (Mg); zinc (Zn); carbon (C); crystalline magnesium-nitride ($Mg_xN_y$) where $x>0$ and $y>0$; crystalline zinc-nitride ($Zn_xN_y$) where $x>0$ and $y>0$; magnesium-aluminium-gallium-nitride ($Mg_u[Al_xGa_{1-y}]_zN_v$) where $u>0$, $x>0$, $0<y<1$, $z>0$ and $v>0$; and zinc-aluminium-gallium-nitride ($Zn_u[Al_xGa_{1-y}]_zN_v$) where $u>0$, $x>0$, $0<y<1$, $z>0$ and $v>0$.

In some embodiments, the donor material or the acceptor material comprises one or more of the atomic species in the Lanthanide series of the periodic table of elements. For example, the donor material or the acceptor material can comprise a majority of Gadolinium (Gd). The donor material or the acceptor material can also be a crystalline lanthanide-nitride composition with formula $L_xN_y$, where L is at least one species of Lanthanide atom and N is nitrogen, where $0<x\le3$ and $0<y\le2$. More preferably, the donor material or the acceptor material is a Gadolinium-nitride ($Gd_xN_y$), where $0<x\le3$ and $0<y\le2$.

In some embodiments, the impurity layers 130-n each form a hexagonal crystal mesh and the host layers have a wurtzite crystal structure. In some embodiments, where the host layers have a wurtzite crystal structure the semiconductor material is silicene or graphene.

Each impurity layer 130-n interposed between adjacent host layers 120-n creates a sheet of spatially confined potential wells, which effectively creates a volume of $n^+$-type or $p^+$-type material in the superlattice 115. For example, a first sheet of potential wells is formed in the impurity layer 130-1 interposed between the host layer 120-1 and the host layer 120-2. A second sheet of potential wells is formed in the impurity layer 130-2 interposed between the host layer 120-2 and the host layer 120-3. A third sheet of potential wells is formed in the impurity layer 130-3 interposed between the host layer 120-3 and the host layer 120-4. The position and amplitude of the potential wells can be varied by varying the periodic spacing d1 of the impurity layers 130-n. The periodic spacing d1 is determined, for example, based on the bandgap of the semiconductor material used to form the host layers 120-n.

The periodic spacing d1 of the impurity layers 130-n can be varied by varying the thickness t2 of the host layers and/or the thickness t3 of the impurity layer. In preferred embodiments, the periodic spacing d1 of the impurity layers 130-n is between about 0.1 nm and about 10 nm.

In the embodiment shown in FIG. 1, the host layers 120-n have a similar thickness in each of the plurality of unit cells and the impurity layers 130-n have a similar thickness in each of the plurality of unit cells. Therefore, the periodic spacing d1 or period is uniform along the superlattice. However, in alternative embodiments, the host layer 130-n has a substantially different thickness in each subsequent unit cell and/or the impurity layer 130-n has a substantially different thickness in each subsequent unit cell. In these alternative embodiments the periodic spacing d1 can be non-uniform along the superlattice.

A wavefunction is a probability amplitude in quantum mechanics that describes the quantum state of a particle and how it behaves. In some embodiments, the periodic spacing d1 of the impurity layers 130-n of the superlattice 115 is such that the electron wavefunctions Ψ in the potential wells induced by the atoms of the donor material or the acceptor material in subsequent impurity layers 130-n spatially overlap. Because the electron wavefunctions Ψ between the impurity layers 130-n overlap, a delocalized "sea" of electrons is formed. For example, if the host layers 120-n are formed of AlN and the periodic spacing d1 of the impurity layers 130-n is about 1 nm to 10 nm this will enable vertical propagation of electrons through the superlattice 115.

In preferred embodiments, the semiconductor material used to form the host layers 120-n is a wide bandgap material, such as AlN which has a bandgap of approximately 6 eV, and the donor or acceptor material used to form the impurity layers 130-n is an ultrathin narrow bandgap material, such as Si. Even though the bulk bandgap of single crystal Si is $E_G(Si)=1.1$ eV, a continuous one monolayer thick Si film disposed across an N-terminated host surface is suitably bonded either side by N bonds and will act as a degenerate doping sheet. The charge deficit of the Si atoms provides a free electron to the crystal. Similarly, a one monolayer Mg sheet incorporated within an AlN host will generate an excess hole. The superlattice leads to higher carrier mobilities along a superlattice growth direction since the carriers are, on the average, more distant from the ionized impurity atom. Therefore, the mobility of the p-type or n-type superlattice is higher than the case of conventional homogeneous but random doping of a host semiconductor. The difference between the electronic bandgaps of the wide bandgap host material and the narrow band gap impurity material coupled with the large difference in electron affinities of each, effectively modulates the positions of the conduction-band and valence-band energies in the superlattice relative to the Fermi energy $E_{Fermi}$.

Donor impurity layers consisting essentially of the donor material effectively modulate the position of the conduction-band energies toward the Fermi energy $E_{Fermi}$ and the position of the valence-band energies away from the Fermi energy $E_{Fermi}$. Donor impurity layers provide $n^+$-type conductivity in localized regions by effectively pulling the lowest conduction band edge Γ below the Fermi energy $E_{Fermi}$. This is described further with reference to FIG. 2A and FIG. 2B.

Acceptor impurity layers effectively modulate the positions of the conduction-band energies away from the Fermi energy $E_{Fermi}$ and the positions of the valence-band energies toward the Fermi energy $E_{Fermi}$. The acceptor impurity layers provide $p^+$-type conductivity in localized regions by effectively moving the CH-valence-band edge closer to the Fermi energy $E_{Fermi}$. This is described further with reference to FIG. 3A and FIG. 3B.

FIG. 2A shows an energy-band diagram 200 of the lowest conduction band Γ (k=0, z) in a superlattice comprising a single donor impurity layer between two host layers. The host layers consist essentially of AlN and the donor impurity layers consist essentially of Si. The energy-band diagram 200 shows the lowest direct conduction band Γ (k=0, z) as a function of a distance z through the structure or a portion of a superlattice. The donor impurity layer provides $n^+$-type conductivity in a localized region by effectively pulling the lowest conduction band Γ (k=0, z) edge below the Fermi energy $E_{Fermi}$. The thickness of the donor impurity layer is 1 nm, but can also be selected as small as one half of a monolayer. The essentially two dimensional (2D) sheet of donor atoms that makes up the donor impurity layer represents a two dimensional sheet donor concentration $N^{2D}_i$. The mean spacing $d_i$ between donor atoms within the sheet is approximately $d_i \sim (N^{2D}_i)^{-1}$, so that an equivalent 3D donor density can be defined as $N^{3D}_i = (N^{2D}_i)^{3/2}$. Therefore, a 2D sheet of donor atoms imparts a large electrostatic potential within the crystal. The resulting band structure due to the 2D sheet is solved using a self-consistent Poisson-Schrödinger equation. Hence, the conduction band structure is modified over a distance well in excess of the thickness of the donor impurity layer.

The donor impurity layer induces a potential well, designated A. The energy-band diagram 200 shows the three lowest energy confined and quantized spatial electron wavefunctions $\Psi^C_{n=1}(z)$, $\Psi^C_{n=2}(z)$, and $\Psi^C_{n=3}(z)$ plotted relative to the lowest direct conduction band Γ (k=0, z). The energy-band diagram 200 shows that the peak of the $\Psi^C_{n=1}(z)$ wavefunction is localized to the induced potential well A. The base of the $\Psi^C_{n=1}(z)$ wavefunction lies below the Fermi energy $E_{Fermi}$ in the host layers and peaks above the Fermi energy $E_{Fermi}$ in the donor impurity layer forming a highly activated region in the donor impurity layer. This donor impurity layer therefore induces a degenerate electron concentration that extends along the plane of the donor impurity layer. This is to be compared to a single crystal host randomly doped by impurity atoms. In the case of random bulk doping the coupling between isolated impurity atom sites is typically too large to cause impurity wavefunction coupling. The doping density in random bulk doped crystals required to achieve impurity wavefunction coupling is greater than the solubility limit of the impurity within the host semiconductor. Therefore, the present method teaches the beneficial attribute of high effective impurity densities without structural compromise of the host semiconductor.

Figure 2B:
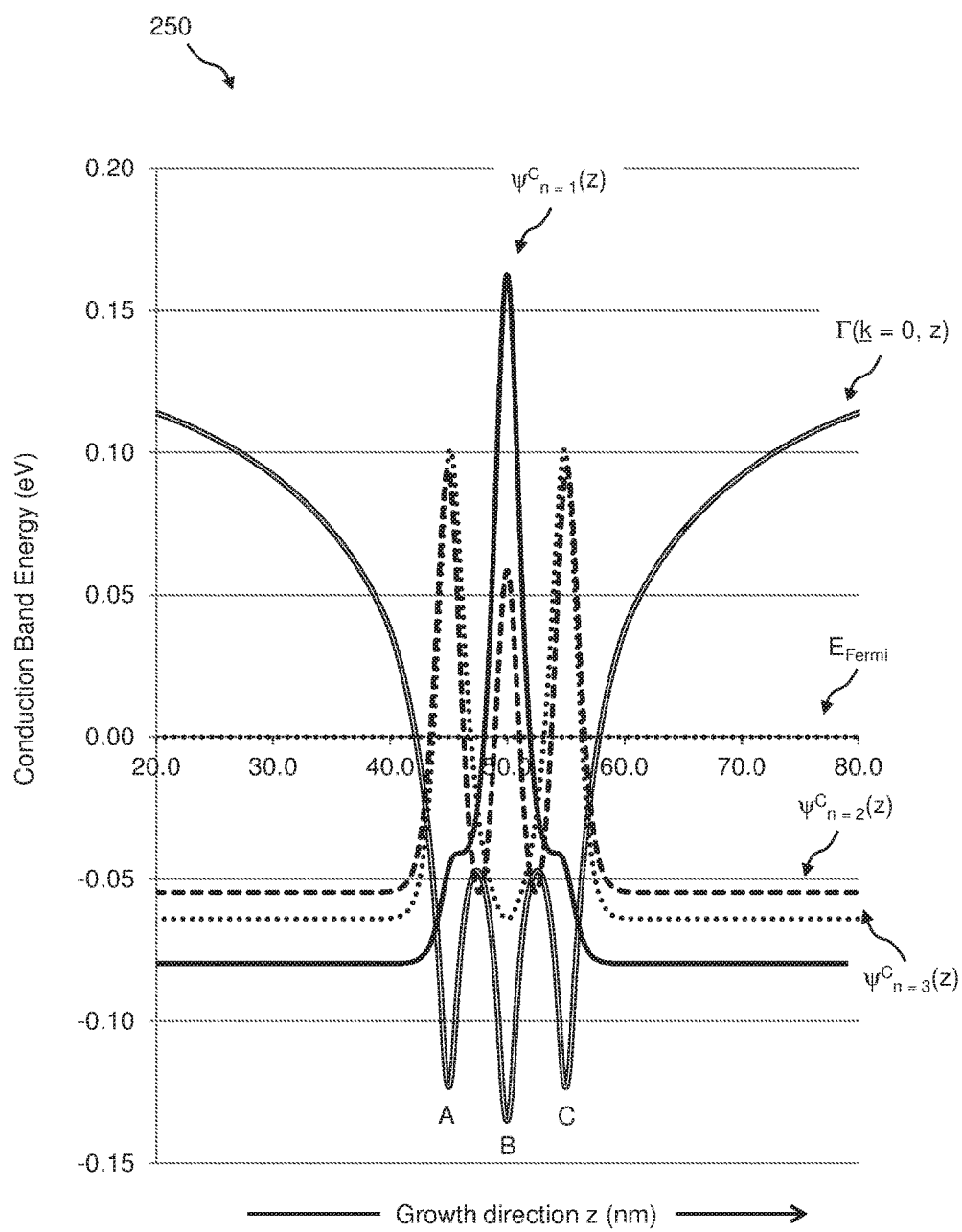
FIG. 2B is an energy-band diagram of the lowest conduction band $\Gamma$ (k=0, z) in a superlattice comprising three donor impurity layers.

FIG. 2B shows an energy-band diagram 250 of the lowest conduction band Γ (k=0, z) in a superlattice comprising three donor impurity layers and four host layers. The host layers consist essentially of single crystal AlN and the donor impurity layers consist essentially of Si as a donor sheet. The energy-band diagram 250 shows the lowest direct conduction band Γ (k=0, z) as a function of the distance z through the superlattice. The donor impurity layers provide n+-type conductivity by effectively pulling the lowest conduction band Γ (k=0, z) below the Fermi energy $E_{Fermi}$. The thickness of each of donor impurity layer is 1 nm, and the distance between the impurity layers is 5 nm. The donor impurity layers induce three potential wells, designated A, B, and C.

The energy-band diagram 250 shows the three lowest energy confined and quantized spatial electron wavefunctions $\Psi^C_{n=1}(z)$, $\Psi^C_{n=2}(z)$, and $\Psi^C_{n=3}(z)$ plotted relative to the conduction band Γ (k=0, z). The energy-band diagram 250 shows that the peaks of the electron wavefunctions $\Psi^C_{n=1}(z)$, $\Psi^C_{n=2}(z)$, and $\Psi^C_{n=3}(z)$ are localized to the induced potential wells A, B and C. The base of the $\Psi^C_{n=1}(z)$ wavefunction lies below the Fermi energy $E_{Fermi}$ and forms highly activated regions in the donor impurity and host layers. The lowest lying quantization energies of the electron wavefunctions $\Psi^C_{n=1}(z)$, $\Psi^C_{n=2}(z)$, and $\Psi^C_{n=3}(z)$ all lie below the Fermi energy $E_{Fermi}$ generating spatially localized electron states in the region 40<z<60 nm along the growth direction. The triple donor impurity layers, each of 1 nm width, thus form a highly activated and mobile donor concentration. It is understood that the high electron density induced extends in the plane of the layers substantially perpendicular to the growth direction z.

Figure 3A:
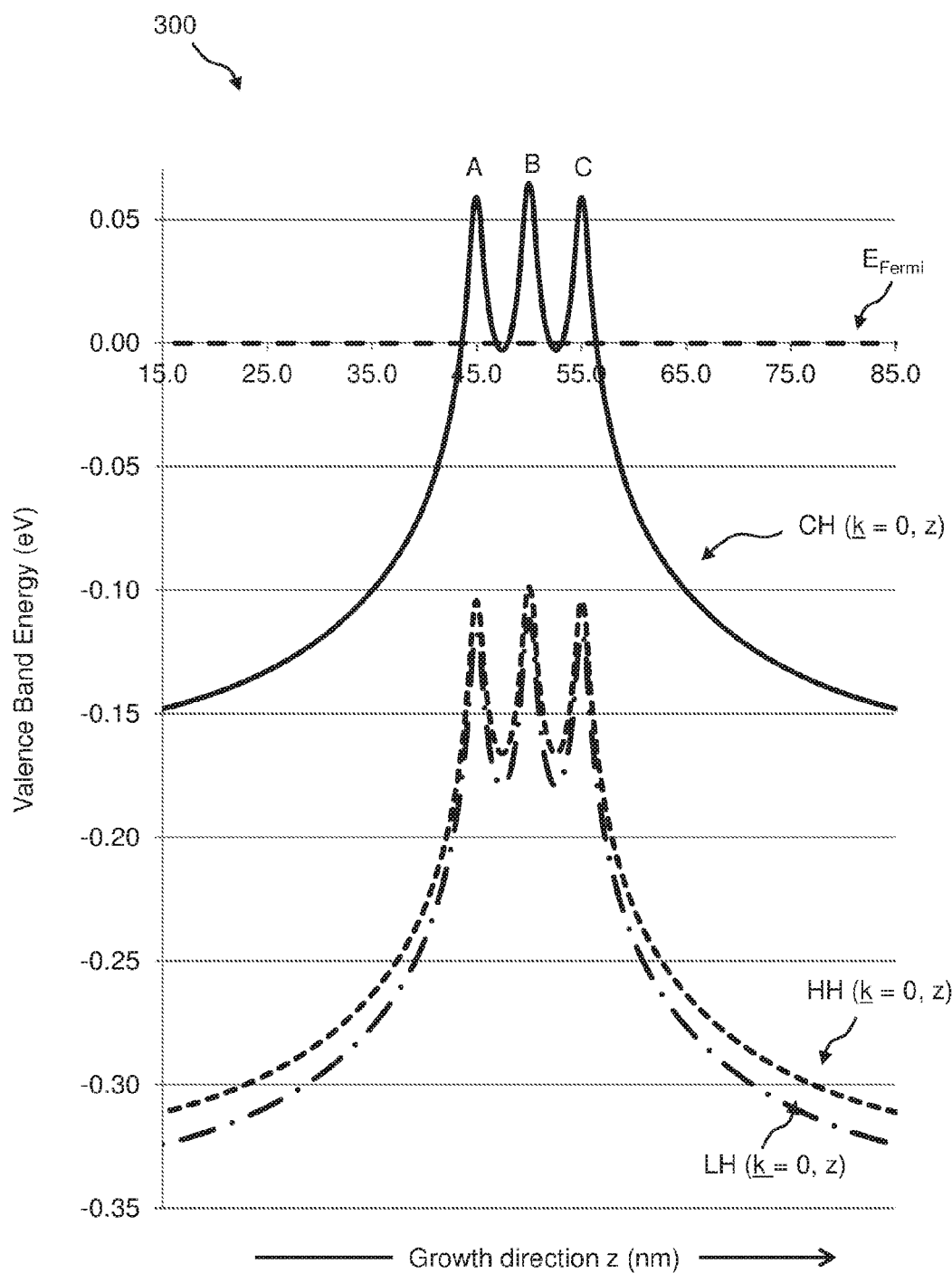
FIG. 3A is an energy-band diagram of the crystal-field-split (CH), heavy-hole (HH), and light-hole (LH) valence-band energies in a superlattice comprising three acceptor impurity layers.

FIG. 3A shows an energy-band diagram 300 of the crystal-field-split CH (k=0, z), heavy-hole HH (k=0, z), and light-hole LH (k=0, z) valence-band energies in a superlattice comprising three acceptor impurity layers and four host layers. The host layers consist essentially of AlN and the acceptor impurity layers consist essentially of a two dimensional sheet of Mg. The energy-band diagram 300 shows the three valence-band energies CH (k=0, z), HH (k=0, z), and LH (k=0, z), as a function of the distance z through the superlattice. The thickness of each of the acceptor impurity layers 130 is 1 nm, and the distance between each of the acceptor impurity layers 130 is 5 nm.

The three acceptor impurity layers induce the potential wells, designated A, B, and C, within each of the three valence bands CH (k=0, z), HH (k=0, z), and LH (k=0, z). The CH (k=0, z) valence band is the highest energy band. In the CH (k=0, z) valence band, the induced potential wells are shifted above the Fermi energy $E_{Fermi}$, providing p+-type conductivity in localized regions of the superlattice at the acceptor impurity layers.

Figure 3B:
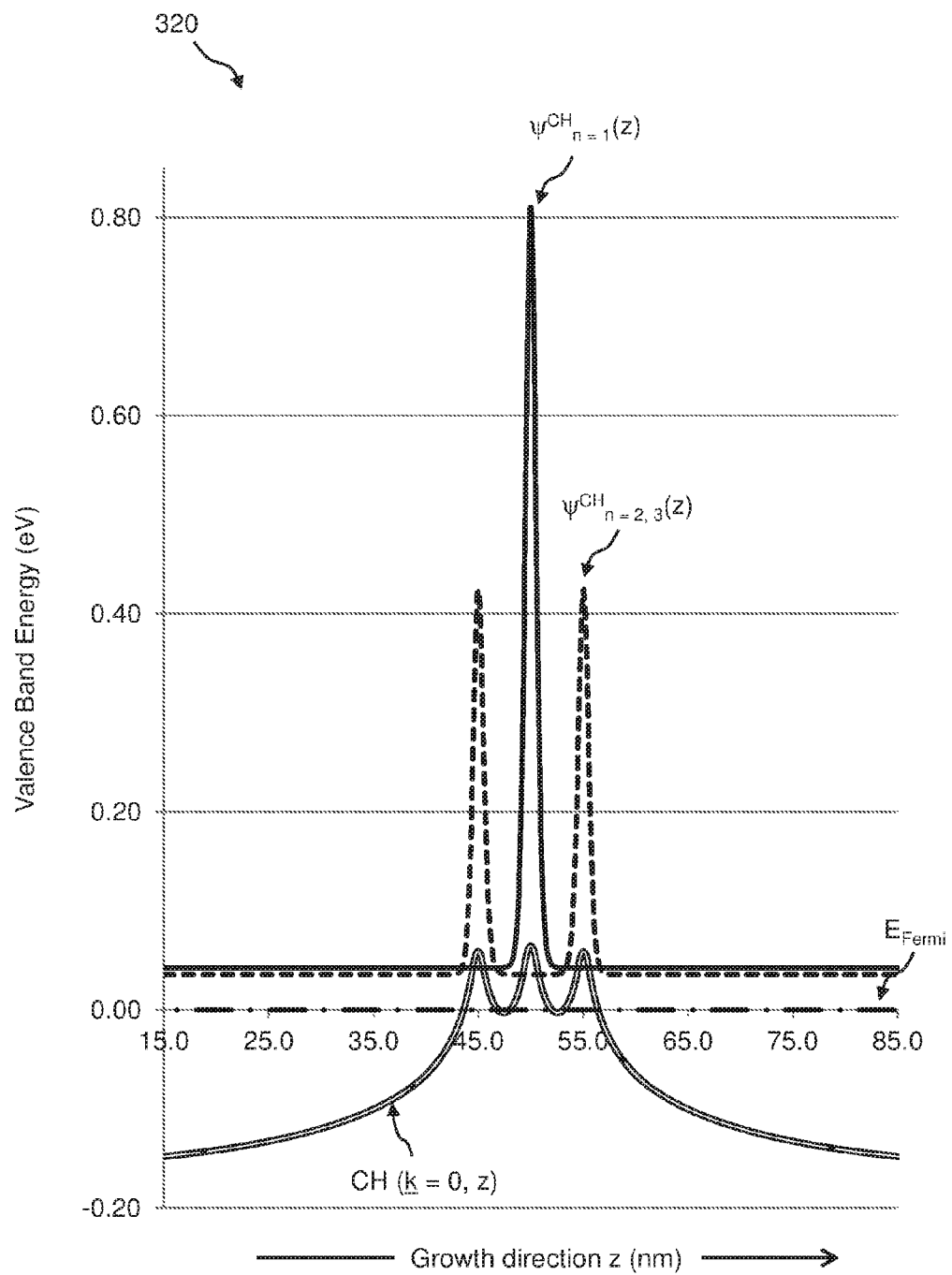
FIG. 3B is an energy-band diagram of the hole wavefunctions in the CH valence band of FIG. 3A.

FIG. 3B shows an energy-band diagram 320 of the hole wavefunctions in the CH valence band of the superlattice of FIG. 3A. The energy-band diagram 320 shows the CH (k=0, z) valence band as a function of the distance z through the superlattice. The energy-band diagram 320 also shows the lowest energy confined and quantized spatial hole wavefunctions $\Psi^{CH}_{n=1}(z)$ and $\Psi^{CH}_{n=2,3}(z)$ plotted relative to the CH (k=0, z) valence band edge. The energy-band diagram 320 shows that the peaks of the hole wavefunctions $\Psi^{CH}_{n=1}(z)$ and $\Psi^{CH}_{n=2,3}(z)$ are localized to the induced potential wells in the CH (k=0, z) valence band. The confined quantized energy eigenstates of the hole wavefunctions $\Psi^{CH}_{n=1}(z)$ and $\Psi^C_{n=2}(z)$ are above the Fermi energy $E_{Fermi}$, and thus form a degenerate hole density.

Figure 3C:
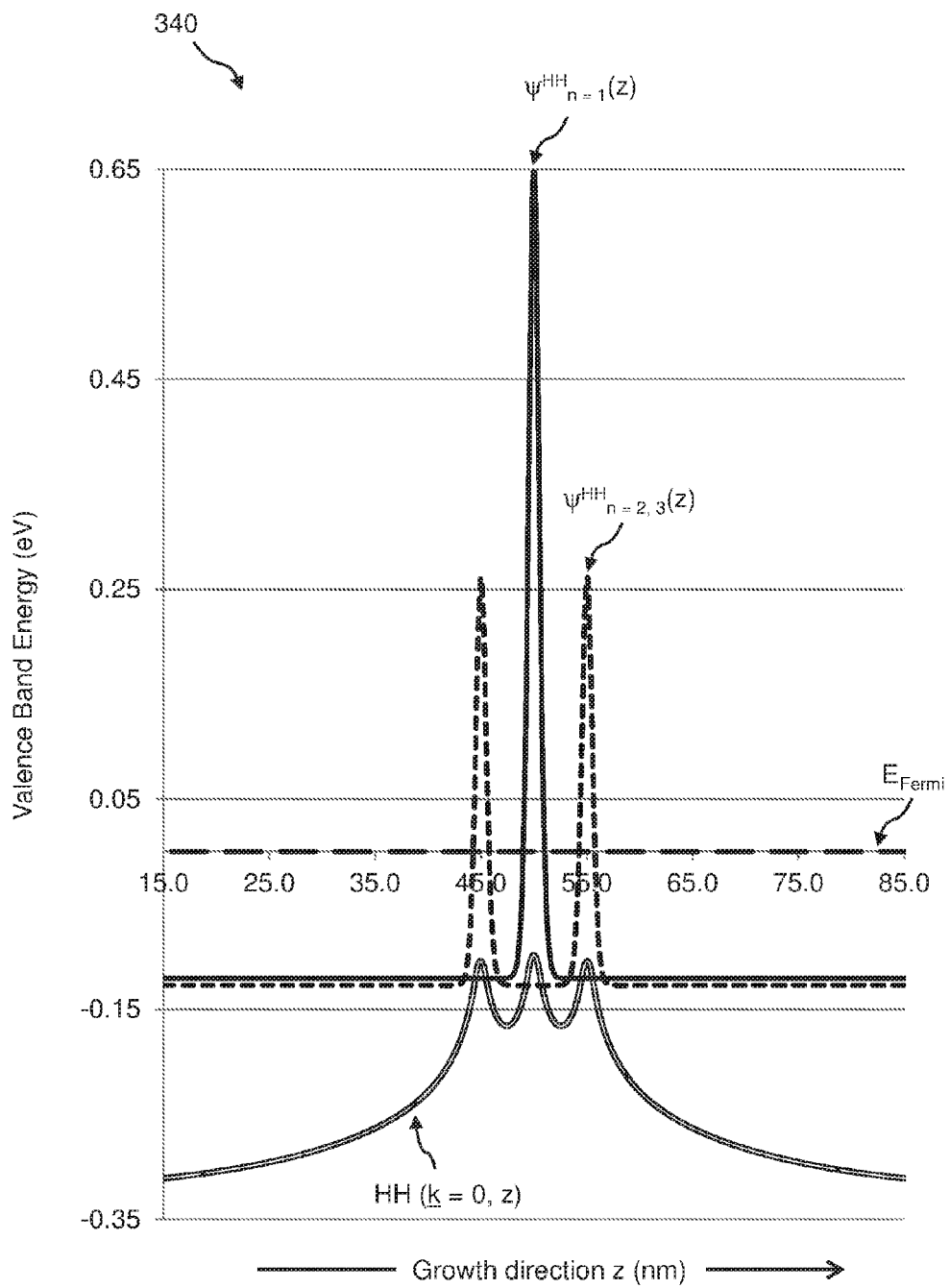
FIG. 3C is an energy-band diagram of the hole wavefunctions in the HH valence band of FIG. 3A.

FIG. 3C shows an energy-band diagram 340 of the hole wavefunctions in the heavy-hole (HH) valence band of the superlattice of FIG. 3A. Referring to FIG. 3C, the energy-band diagram 340 shows the HH (k=0, z) valence band edge as a function of the distance z through the superlattice. The energy-band diagram 340 also shows the lowest energy, quantized spatial hole wavefunctions $\Psi^{HH}_{n=1}(z)$ and $\Psi^{HH}_{n=2,3}(z)$ plotted relative to the HH (k=0, z) valence band. The energy-band diagram 340 shows that the hole wavefunctions are spatially localized to the induced potential wells. It should be noted however, that the corresponding conduction band will provide only two potential wells for electrons. Electron transport along z in the conduction band will therefore experience a large potential barrier with resonant tunneling states defined by the respective eigenenergies. That is, in general, for the case where the host layers all have the same composition and the impurity layers are all of the same type (i.e. donor or acceptor), there will exist for a thus formed superlattice comprising N donor impurity layers N conduction band potential wells and N−1 valence band potential wells. Conversely, for a superlattice comprising N acceptor layers, there will exist N valence band potential wells and N−1 conduction band potential wells.

Figure 3D:
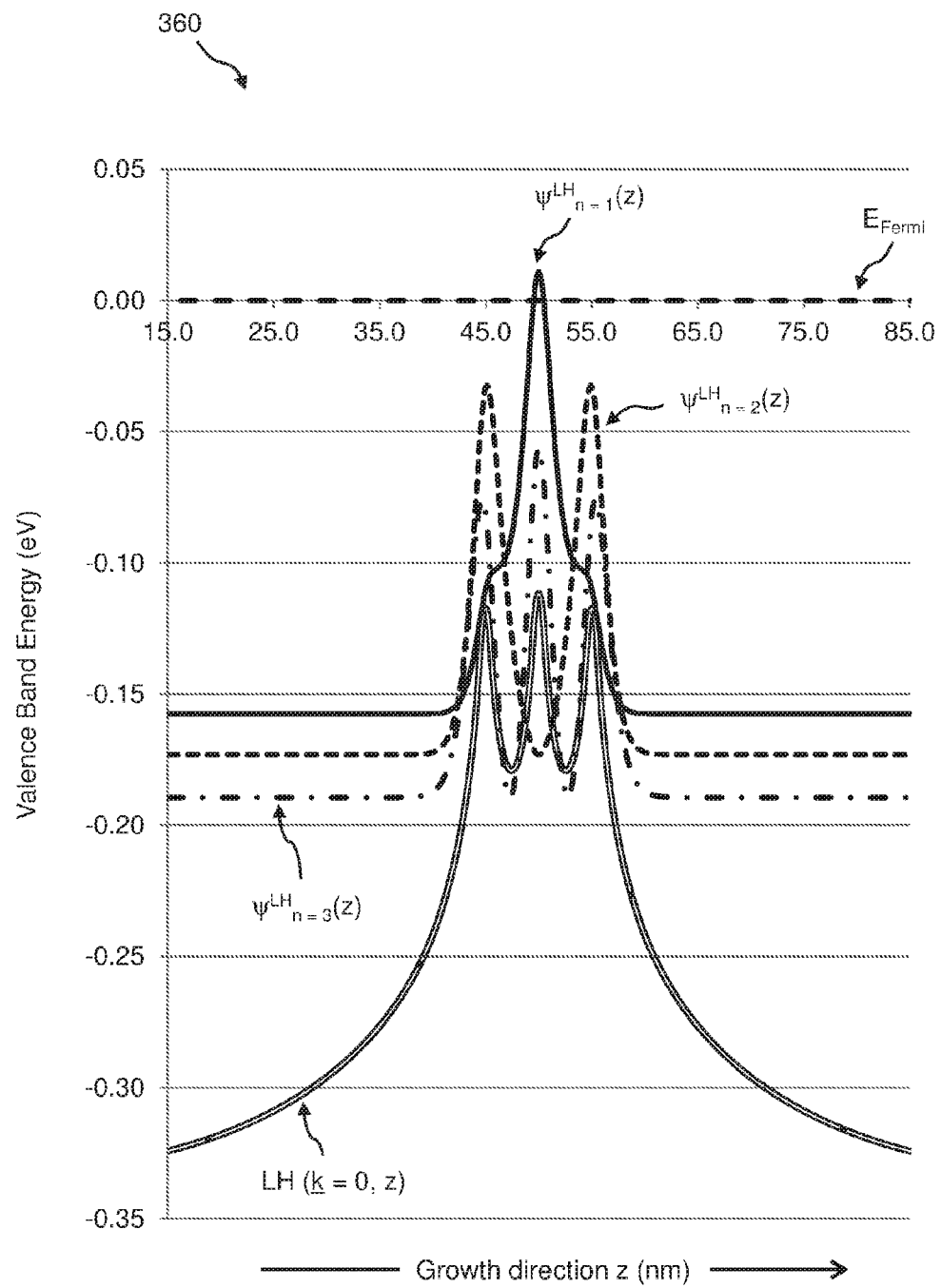
FIG. 3D is an energy-band diagram of the hole wavefunctions in the LH valence band of FIG. 3A.

FIG. 3D shows an energy-band diagram 360 of the hole wavefunctions in the light-hole (LH) valence band of the superlattice of FIG. 3A. The energy-band diagram 360 shows the LH (k=0, z) valence band as a function of distance z through the superlattice. The energy-band diagram 360 also shows the lowest energy, quantized spatial hole wavefunctions $\Psi^{LH}_{n=1}(z)$, $\Psi^{LH}_{n=2}(z)$, and $\Psi^{LH}_{n=3}(z)$ plotted relative to the LH (k=0, z) valence band. The energy-band diagram 360 shows that the LH wavefunctions are spatially localized to the potential wells induced by the impurity layer. The n=1 LH quantized energy is not above the Fermi level and forms a non-degenerate LH distribution relative to the LH band edge.

The superlattices and portions of superlattices described above can provide a high level of n-type or p-type conductivity.

The optical and electrical properties of the superlattice can be altered by changing the period and/or the duty cycle of the unit cells. For example, the superlattice can be made transparent to a design wavelength of an electronic device enabling propagation of light from or to the electronic device through the superlattice. Short period and/or small spacings between impurity layers induce a so called type-II band structure wherein the conduction band minimum does not spatially coincide with the valence band maximum. Such superlattices with type-II real space band structure induce indirect energy-momentum dispersion and thus reduce optical absorption near the fundamental superlattice bandgap relative to the isolated bulk semiconductor material of the host layer.

That is, a superlattice can be engineered using the teachings herein to produce a type-II superlattice having a type-II band structure.

Furthermore, a superlattice comprising a high density of impurity species confined substantially to an impurity layer produces a large coupling between impurity atom wavefunctions within the plane of the impurity layer. Increasing the coupling between adjacent impurity atoms or species within the plane of the impurity layer reduces the activation energy $E_{act}$ (SL) of the impurity compared to the sparse doping case wherein the same impurity species are randomly and sparsely substituted within a single crystal semiconductor host material having activation energy $E_{act}$(i:bulk).

This activation energy, lowered by the superlattice method, produces $E_{act}$ (SL)<$E_{act}$(i:bulk), and therefore produces a higher active carrier density for a given operating temperature. This is particularly advantageous for wide band gap host semiconductors, such as in the host layer.

Such an electronic device is described below with reference to FIGS. 5-13.

A Method of Making a Superlattice

According to another aspect, embodiments of the present invention relate to a method of making a superlattice via a film formation process. In preferred embodiments the superlattice is a p-type or n-type superlattice and made via a substantially two-dimensional thin film formation process. However, the method can also be used to make any of the superlattices described herein (for example superlattices for use in electronic devices having p-type and n-type regions and in some cases an intrinsic region). The film formation process can be, for example, a vacuum deposition process, a molecular beam epitaxy (MBE) process, a vapour phase deposition process, a chemical deposition process, or any other formation process that is capable of precisely forming layers of a given thickness in the range of 0.1 nm to 100 nm.

Figure 4:
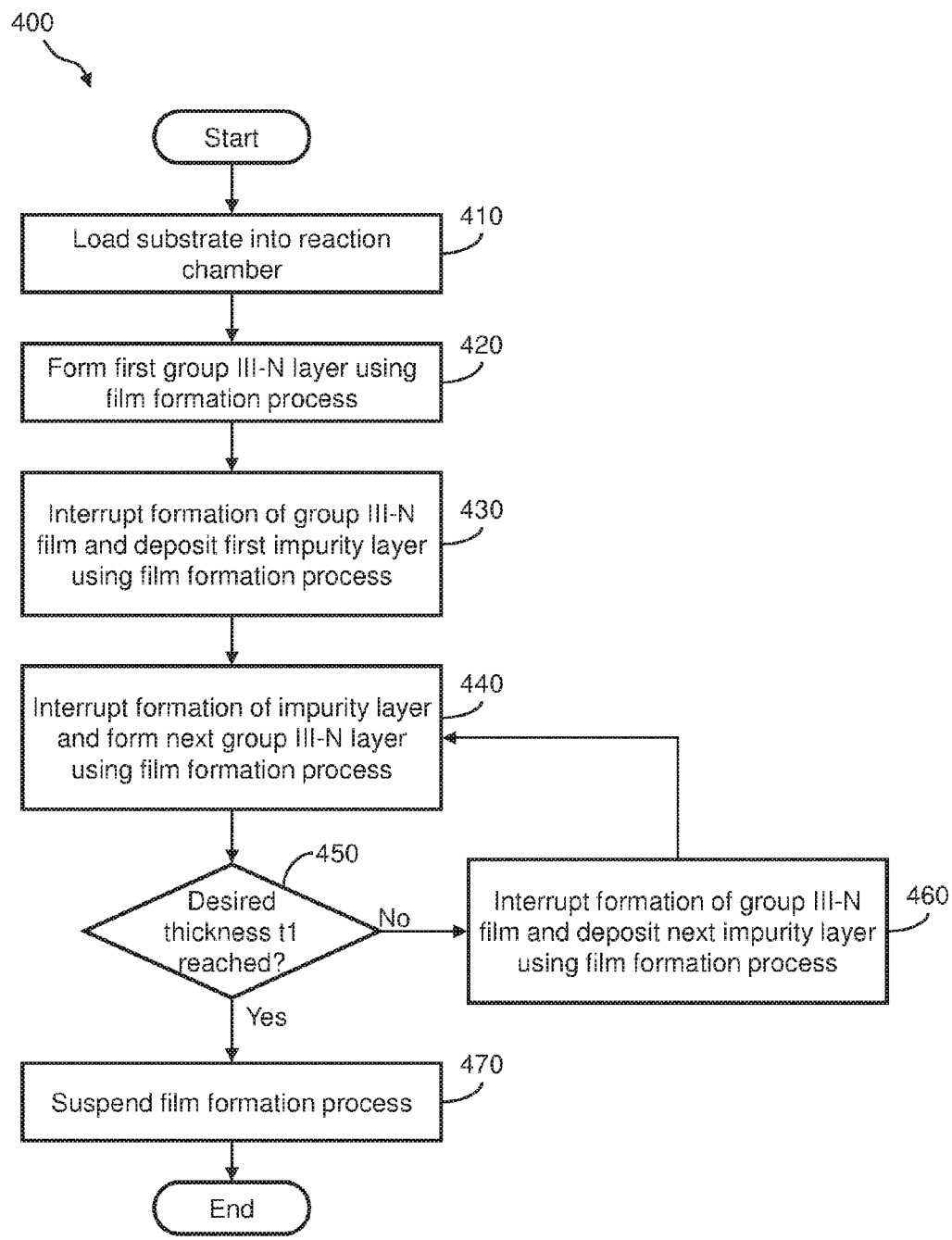
FIG. 4 is a flow diagram of a method of making a superlattice in accordance with some embodiments, according to an embodiment of the present invention.

For example, the film formation process is an MBE process, the group III metal nitride semiconductor material is selected as a wideband gap semiconductor AlN and the donor material is selected as Si. A mechanical shutter is associated with each material source (e.g., Al, N, and Si). Each shutter is positioned in the beam path of the species that is emitted from the material source intersecting the line of sight of the beam between the source and the deposition plane of the substrate. The shutters are used to modulate the outputs of each material source species as a function of time for given calibrated arrival rates of source materials at the said deposition plane. When open, each shutter allows the corresponding species to impinge the deposition surface and participate in epitaxial layer growth. When closed, each shutter prevents the corresponding species from impinging the deposition surface and thus inhibits the respective species from being incorporated within a given film. A shutter-modulation process may be used to readily form atomically abrupt interfaces between the alternately disposed layers of the superlattice. The shutter sequences 150 for such a film formation process are shown in FIG. 4A. The method will now be described in more detail with reference to FIG. 4.

FIG. 4 is a flow diagram of a method 400 of making a superlattice via a film formation process. The method 400 comprises the following steps.

At step 410, a substrate is prepared to have a surface of desired crystal symmetry and cleanliness devoid of disadvantageous impurities. The substrate is loaded into a reaction chamber, for example an MBE reaction chamber, and then the substrate is heated to a film formation temperature. In some embodiments, the film formation temperature is between about 200° C. and about 1200° C. In some embodiments, the film formation temperature is between about 500° C. and 850° C. In preferred embodiments, the reaction chamber is sufficiently deficient of water, hydrocarbons, hydrogen (H), oxygen (O) and carbon (C) species so as to not impact the electronic or structural quality of the superlattice.

At step 420, a first host layer 120-n consisting essentially of a group III metal nitride semiconductor material is formed via the film formation process on the prepared substrate 110. The host layer 120-n is formed to a thickness t2. For example, if the film formation process is MBE and the group III metal nitride semiconductor material is AlN, the shutters associated with the sources of elemental aluminum and excited molecular nitrogen are opened and a layer of AlN is formed. In this example, the source of elemental aluminum can be a conventional effusion cell and the source of excited molecular nitrogen species can be a plasma source. Other active-nitrogen sources can be used, for example ammonia and activated ammonia via a plasma.

At step 430, the formation of the first host layer 120-n is interrupted and a first impurity layer 130-n consisting essentially of a corresponding donor or acceptor material is formed using the film formation process. The impurity layer 130-n is formed to a thickness t3. In preferred embodiments, a first nitrogen terminated surface is formed on the first host layer prior to forming the first impurity layer and the first impurity layer 130-n is formed on the first nitrogen terminated surface. For example, if the film formation process is MBE, the group III metal nitride semiconductor material is AlN and the donor material is Si, the shutter associated with the aluminum source is closed and a layer of nitrogen species is deposited to form a nitrogen-terminated surface. The shutter associated with the active nitrogen species is then closed, a shutter associated with a source of Si is opened and the first impurity layer is formed atop the entire surface of the first host layer formed in step 420. In one example, the source of Si is an elemental silicon effusion cell comprising a pyrolytic boron nitride (PBN) crucible. In preferred embodiments, donor or acceptor material adatoms are chemisorbed and/or physisorbed on the nitrogen terminated surface and deposition is substantially self-limited by the available nitrogen bonds on the surface. In some embodiments, the surface is supersaturated with the donor or acceptor material and the donor or acceptor material is both physisorbed and chemisorbed. In one example, the deposited impurity layer is a monolayer of Si which ideally forms a reconstructed surface of the same symmetry type as the underlying surface of the host layer. For example, if the host layer is wurtzite AlN, then the impurity layer, being a monolayer of Si, can form a hexagonal mesh referred to herein as Silicene. In another example, one or more Si and N layers, being monolayered atomic planes, can be deposited along a growth direction with a stacking sequence of the form of —N—Si—N—Si— . . . —N.

At step 440, the formation of the first impurity layer 130-n is interrupted and a second host layer 120-n is formed using the film formation process. In preferred embodiments, a second nitrogen terminated surface is formed on the impurity layer prior to forming the second host layer 120-n. For example, if the film formation process is MBE, the group III metal nitride semiconductor material is AlN and the donor material is Si, the shutter associated with the Si source is closed, the shutter associated with the active nitrogen species is opened, and a layer of nitrogen species is deposited to form a nitrogen-terminated surface. The shutter associated with the aluminum source is then opened and the second host layer is formed using the film formation process. The thickness t2 of the host layer 120-n is based, for example, on the periodic spacing d1 between impurity layers 130-n and the thickness t3 of the impurity layers.

At step 450, it is determined whether the superlattice has reached a desired thickness t1. The desired thickness is defined along the growth direction, i.e. perpendicular to the plane of the layers. If the number of unit cells or impurity layers 130-n required to achieve the desired thickness t1 has been achieved, then the method 400 proceeds to step 470. However, if the superlattice has not reached a desired thickness or does not yet comprise a desired number of layers, the method 400 proceeds to step 460. In preferred embodiments, the desired number of layers is at least 10 host layers 120-n and at least 10 impurity layers 130-n and/or the desired thickness is between about 50 nm and about 5 μm. It is understood that a large number of periods can be deposited, such as of the order 100 or 1000.

At step 460, the formation of the second host layer is interrupted and a second impurity layer is formed using the film formation process. For example, if the film formation process is MBE, the group III metal nitride semiconductor material is AlN and the donor material is Si, the shutter associated with the aluminum source is closed and a layer of nitrogen species is deposited to the host layer to form a nitrogen-terminated surface. The shutter associated with the active nitrogen species is then closed, the shutter associated with the source of Si is opened and the second impurity layer is formed atop the entire surface of the host layer previously formed in step 440. The method 400 then returns to step 440.

When the desired thickness or desired number of layers of the superlattice has been achieved, at step 470, the film formation process is suspended and the structure comprising the substrate 110 and the superlattice is removed from the reaction chamber. For example, the material sources are deactivated, the reaction chamber is allowed to cool, and then the structure is removed from the reaction chamber.

In some embodiments, in steps 430 and 460 the impurity layers 130-n are single atomic layers or monolayers of donor or acceptor material. In some embodiments, the impurity layers 130-n are at least one monolayer and less than five monolayers of donor or acceptor material. In some embodiments, the impurity layers are at least one monolayer and less than or equal to two monolayers of donor or acceptor material.

In one example, a single atomic layer of Si or Mg can be formed to provide the superlattice with n-type or p-type conductivity, respectively. In another example, the impurity layers can be an impurity adatom matrix, such as 1 to 5 atomic layers of a single crystalline structure, such as $Si_xN_y$, where x>0 and y>0 or $Mg_pN_q$ p>0 and q>0. In yet another example, the impurity layers are alloys of $Si_u(Al_xGa_{1-x})_yN_v$ or $Mg_u(Al_xGa_{1-x})_yN_v$, where x≥0, y≥0, u>0 and v≥0.

In some embodiments, the host layers 120-n and the impurity layers 130-n have a predetermined crystal polarity, such as a substantially metal polar polarity or a nitrogen polarity along a growth direction.

In some embodiments, the host layers 120-n and the impurity layers 130-n have a predetermined strain imposed by the impurity layer on to the host layer. For example, the superlattice can be engineered to have the host layers in a state of biaxial compression or biaxial tension relative to the buffer layer and substrate wherein the biaxial compression or biaxial tension is induced by the impurity layers. For example, an n-type superlattice formed using AlN host layers and Si impurity layers provides biaxial compression in the AlN host layer.

An Electronic Device

According to another aspect, the invention resides in an electronic device comprising an n-type superlattice providing n-type conductivity and a p-type superlattice providing p-type conductivity. For example, the electronic device can be a UV LED or a UV light detector. Particularly, the electronic device can be a UV LED operating in the optical wavelength range between 150 nm to 280 nm, and more preferably in the optical wavelength range between 190 nm to 250 nm.

The n-type superlattice comprises alternating host layers and donor impurity layers. The host layers of the n-type superlattice consist essentially of a group III metal nitride semiconductor material and the donor impurity layers consist essentially of a corresponding donor material. The p-type superlattice comprises alternating host layers and acceptor impurity layers. The host layers of the p-type superlattice consist essentially of the group III metal nitride semiconductor material and the acceptor impurity layers consist essentially of a corresponding acceptor material. The n-type superlattice and p-type superlattice can be the superlattice 115 described above, and the group III metal nitride semiconductor material, the donor material and/or the acceptor material can be the materials described in relation to the superlattice 115.

In some embodiments, the n-type superlattice and the p-type superlattice form a PN junction. In other embodiments, the electronic device further comprises an intrinsic region between the n-type superlattice and the p-type superlattice to form a PIN junction. Here the term "intrinsic region" has been used in line with convention and is not intended to suggest that the intrinsic region is always formed of a near pure semiconductor material. However, in some embodiments the intrinsic region is formed essentially of one or more not intentionally doped or pure semiconductor materials, particularly one or more semiconductor materials of the host layer.

In preferred embodiments, the electronic device can be considered to be a homojunction device because the same group III metal nitride semiconductor material is used throughout most or all of the electrical and optical layers of the electronic device. Because the same group III metal nitride semiconductor material is used throughout most or all of the electrical and optical layers of the electronic device, the refractive index is the same throughout these layers of the electronic device.

In preferred embodiments, a period and/or a duty cycle of the p-type superlattice and/or the n-type superlattice is such that the p-type superlattice and/or the n-type superlattice is transparent to a photon emission wavelength or a photon absorption wavelength of the intrinsic region or a depletion region of a PN junction. This enables light emitted from, or absorbed by the intrinsic region or the depletion region of the PN junction to efficiently enter or leave the device. Ideally, the depletion region is engineered for optimal optical generation probability by efficient recombination of injected electrons and holes from the respective n-type and p-type superlattice regions.

Figure 5:
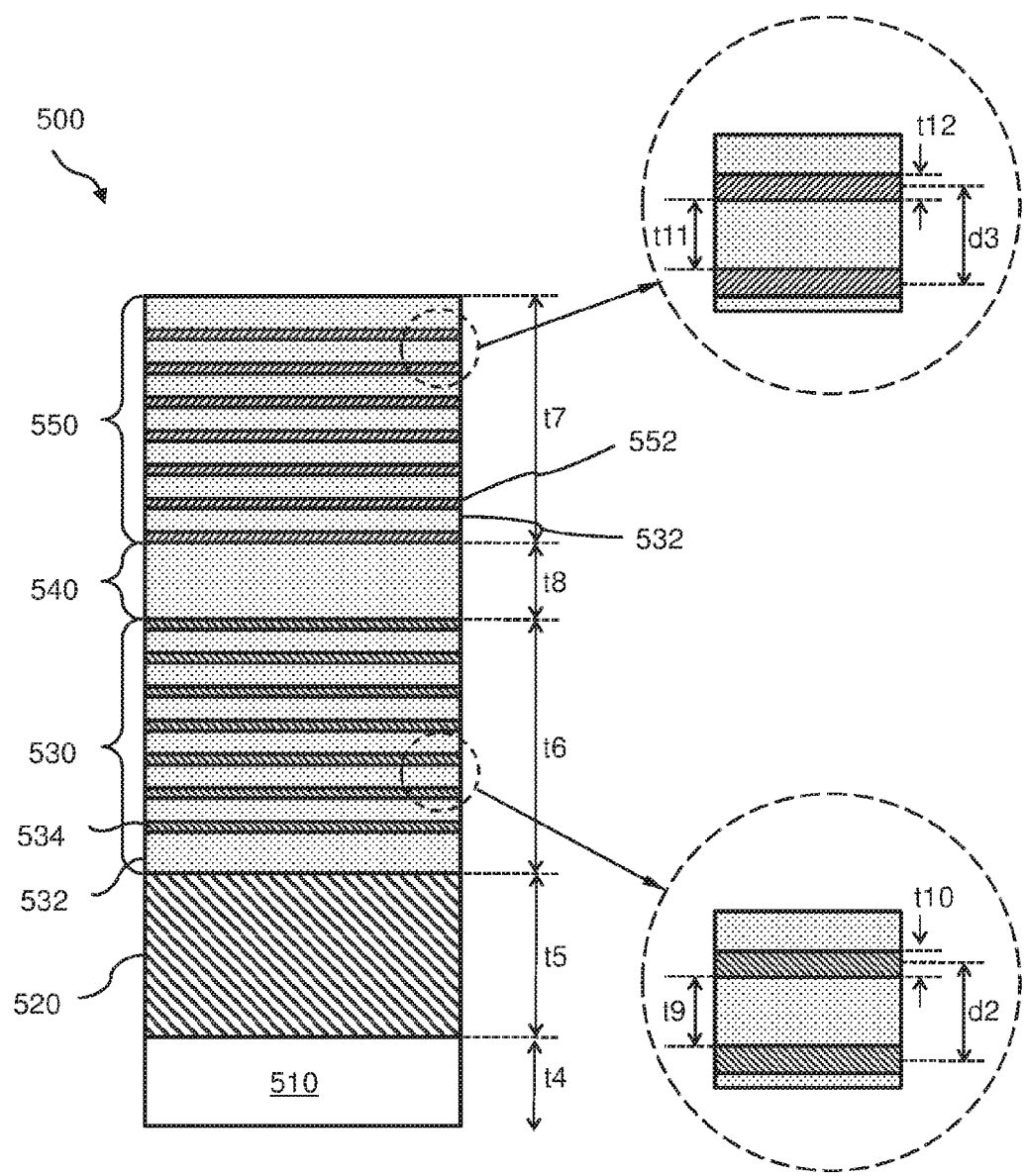
FIG. 5 is a cross-sectional view of an electronic device, according to an embodiment of the present invention.

FIG. 5 is a cross-sectional view of an electronic device 500, according to an embodiment of the present invention. The electronic device 500 is a PIN device and comprises a substrate 510, a buffer region 520, an n-type superlattice 530, an intrinsic layer 540, and a p-type superlattice 550. The device can be produced by forming the buffer region 520, the n-type superlattice 530, the intrinsic layer 540 and the p-type superlattice 550 in order on the substrate 510.

The substrate 510 has a thickness t4, which in preferred embodiments is between about 300 μm and about 1,000 μm. In preferred embodiments, the thickness t4 is chosen in proportion to a diameter of the substrate 510, such that the larger the diameter of the substrate, the larger the thickness t4.

In preferred embodiments, the substrate 510 is substantially transparent to a design wavelength of the electronic device. The design wavelength can be an emission wavelength of the electronic device 500 where the electronic device 500 is a UV LED or can be an absorption wavelength of the electronic device 500 where the electronic device 500 is an UV light detector. In preferred embodiments, the emission wavelength or the absorption wavelength is between 150 nm and 280 nm, and preferably between 190 nm and 250 nm. For example, the substrate 510 can be formed of a material that is substantially transparent to UV light, such as sapphire. In preferred embodiments, the material for the substrate can be selected from one of: a native group III metal nitride material, such as AlN or GaN, a metal oxide material, such as sapphire, magnesium oxide (MgO) or zinc-oxide (ZnO), silicon (Si), silicon-carbide (SiC), Calcium Fluoride ($CaF_2$), a crystalline thin film semiconductor on amorphous glass, or a thin film crystalline semiconductor on metal.

In alternative embodiments, the substrate 510 is substantially non-transparent to the design wavelength of the electronic device 500. For example, the substrate 510 can be formed of a material that is substantially non-transparent to UV light, such as Si. The substrate 510 can be substantially insulating or substantially conductive. For example, the substrate 510 can be formed of Si (111) that has been doped to a high level of conductivity. In some embodiments, an optical access port can be optionally micro-machined or etched to enable efficient optical extraction using a through hole via technology used routinely in commercial CMOS processing.

The buffer region 520 has a thickness t5, which in preferred embodiments is between about 10 nm and about 1 μm and preferably between 100 nm and 500 nm. The buffer region 520 is formed sufficiently thick to have low defect density at a surface adjacent to the n-type superlattice 530. For example, the defect density of the buffer region 520 is about $10^8$ cm$^{-3}$ or less.

In preferred embodiments, the buffer region 520 consists essentially of AlN and/or GaN, preferably as bulk-like materials. In some embodiments, the buffer region comprises a ternary bulk alloy with composition $Al_xGa_{1-x}N$, $0 \leq x \leq 1$. In some embodiments, the buffer region comprises a group III metal oxide of the form $(A_xB_{1-x})_2O_3$, where A and B are selected from at least two of Al, In and Ga.

In some embodiments, the buffer region 520 comprises a buffer layer formed on a template layer, where the buffer layer consists essentially of the same group III metal nitride semiconductor material as host layers 532 of the n-type superlattice 530 and the p-type superlattice 550 and the template layer consists essentially of AlN.

In alternative embodiments, the buffer region 520 comprises a superlattice, such as a short-period superlattice, formed of alternating layers of AlN and GaN with a bulk composition equivalent to the group III metal nitride semiconductor material of the host layers 532. Such a superlattice structure can be used to further reduce the defect density in the buffer region 520 by introducing lateral strain energy to reduce threading dislocations.

The n-type superlattice 530 comprises alternating host layers 532 and donor impurity layers 534. The host layers 532 consist essentially of a group III metal nitride semiconductor material, for example, $Al_{0.7}Ga_{0.3}N$. The donor impurity layers 534 consist essentially of a corresponding donor material, for example, Si.

The p-type superlattice 550 comprises alternating host layers 532 and acceptor impurity layers 552. The host layers 532 of the p-type superlattice 550 consist essentially of the same group III metal nitride semiconductor material as the host layers 532 of n-type superlattice 530. The acceptor impurity layers 552 consist essentially of a corresponding acceptor material, for example, Mg.

The n-type superlattice 530 has a thickness t6 and the p-type superlattice 550 has a thickness t7. These thicknesses can be the thickness described above as thickness t1. The thicknesses t6 and t7 can be selected to substantially reduce parasitic absorption of light of the design wavelength of the electronic device 500. For example, $Al_{0.7}Ga_{0.3}N$ has an emission wavelength of 220 nm.

An optical thickness of the n-type superlattice 530 can be determined from the refractive index of the group III metal nitride semiconductor material used to form the n-type superlattice 530. The optical thickness is selected for efficient extraction of light from the electronic device 500.

In some embodiments, the thickness t6 of the n-type superlattice 530 is selected to facilitate formation of an ohmic contact (not shown) on the electronic device 500. In some embodiments, the thickness t6 is at least about 250 nm to facilitate fabricating an ohmic contact using a selective mesa-etching process.

The host layers 532 of the n-type superlattice 530 and the p-type superlattice 550 have a thickness t9 and a thickness t11, respectively. These thicknesses can be the thickness described above as thickness t2. The donor impurity layers 534 have a thickness t10 and the acceptor impurity layers 552 have a thickness t12. These thicknesses can be the thickness described above as thickness t3.

The n-type superlattice 530 has a period d2 and the p-type superlattice 550 has a period d3. In preferred embodiments, period d2 and/or period d3 are based on the design wavelength of the electronic device 500. In the present embodiment, the period d2 and the period d3 are uniform. However, in alternative embodiments, period d2 and/or period d3 can be non-uniform. The periods d2 and d3 can be the period described above as period d1.

The n-type superlattice 530 can be considered to have a plurality of unit cells each consisting of a host layer 532 and a donor impurity layer 534. The p-type superlattice 550 can be considered to have a plurality of unit cells each consisting of a host layer 532 and an acceptor impurity layer 552. The optical properties of the n-type superlattice 530 and the p-type superlattice 550 can be selected by changing the period and/or duty cycle of the unit cells in the superlattice. In the present embodiment, the period d2 and the period d3 are the same. However, in alternative embodiments, period d2 and the period d3 can be different enabling different optical properties to be selected on either side of the intrinsic region 540.

In preferred embodiments, the intrinsic region 540 is the active region of electronic device 500 wherein electrons from the n-type superlattice 530 and holes from the p-type superlattice 550 recombine to emit photons. The intrinsic region 540 has a thickness t8, which in preferred embodiments is less than 500 nm, and is preferably about one half the emitted optical wavelength or an even multiple of the optical wavelength. The thickness t8 of the intrinsic region 540 is selected for efficient recombination of electrons from the n-type superlattice 530 and holes from the p-type superlattice 550.

In preferred embodiments, the intrinsic region 540 consists essentially of one or more group III metal nitride semiconductor materials. For example, the intrinsic region 540 can consist of the group III metal nitride semiconductor material used in the host layers 532 of the n-type superlattice and the p-type superlattice, for example $Al_{0.7}Ga_{0.3}N$, which has an emission wavelength of 220 nm. In some embodiments, the one or more group III metal nitride semiconductor materials are configured such that the intrinsic region 540 has a bandgap that varies along a growth direction.

For example, the intrinsic region 540 can comprise at least one of the following: a pure group III metal nitride semiconductor material; a group III metal nitride semiconductor material including at least one crystal structure modifier, wherein the crystal structure modifier is selected from at least one of: hydrogen (H), oxygen (O), carbon (C), rare-earth or lanthanide metal; and a not-intentionally doped (NID) group III metal nitride semiconductor material. The crystal structure modifier can produce a predetermined effect of at least one of: improving the material quality, altering the emission wavelength and altering the intrinsic strain state of the intrinsic region relative to the other regions of the superlattice.

In an alternative embodiment, the intrinsic region 540 comprises an impurity layer. The impurity layer consists essentially of: a donor material corresponding to the one or more group III metal nitride semiconductor materials of the intrinsic region; an acceptor material corresponding to the one or more group III metal nitride semiconductor materials of the intrinsic region; a compensated material comprising a donor material and an acceptor material corresponding to the one or more group III metal nitride semiconductor materials of the intrinsic region, such as Si and Mg; or a rare earth metal, such as Gd.

In some embodiments, the intrinsic region comprises an optical recombination superlattice. For example, the intrinsic region 540 can comprise a superlattice comprising a repeating unit cell of the following layers of material [host/Si/host/Gd/host/Mg], where host is a host semiconductor material, such as the group III metal nitride semiconductor material of the host layer.

In some embodiments, the optical recombination superlattice comprises host layers consisting essentially of a host semiconductor material and an impurity layer that is optically active. The impurity layer, for example, consists essentially of a material that is selected from a lanthanide species that is incorporated in a triply ionized state. The Lanthanide species within the optical recombination superlattice thus forms a prepared 4-f shell electronic manifold intrinsic to the Lanthanide atoms incorporated within the optical recombination superlattice. The 4-f electronic manifold of the triply ionized and atomically bonded Lanthanide specie is embedded on an electronic energy scale substantially within the bandgap energy of the host semiconductor material of the optical recombination superlattice.

Electrons and holes are injected into the optical recombination superlattice from the n-type and p-type superlattices, respectively, wherein the electrons and holes recombine transferring energy to the 4-f shell states of the Lanthanide specie in the impurity layer of the optical recombination superlattice and thus excite the said 4-f shell states. Relaxation of the excited 4f-shell states creates intense and sharp optical emission that is transmitted through the entire electronic device by virtue of the n-type and p-type superlattices being optically transparent.

In alternative embodiments, the intrinsic region 540 is omitted from the electronic device 500 shown in FIG. 5. In these embodiments, the p-type superlattice 550 is formed directly atop the n-type superlattice 530 and the electronic device is a homojunction PN device.

Figure 5B:
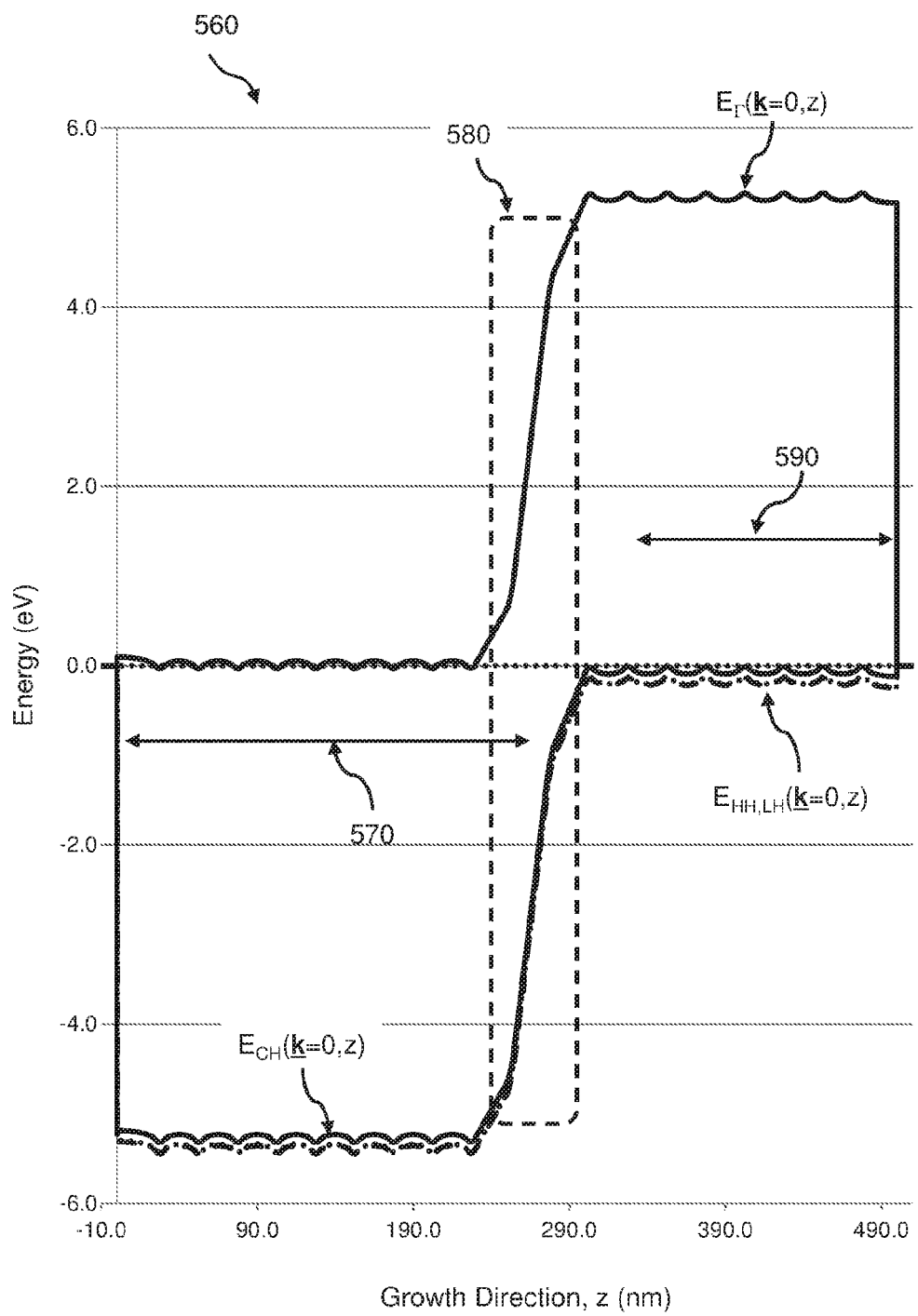
FIG. 5B is a plot of the spatial energy band structure of a PIN device comprising an n-type superlattice, a p-type superlattice and an intrinsic region.

FIG. 5B is a plot 560 of the spatial energy band structure of a PIN device comprising an n-type superlattice 570, a p-type superlattice 590 and an intrinsic region 580. The conduction band $E_\Gamma(k=0,z)$ and the three valence band edges $E_{HH}(k=0,z)$, $E_{CH}(k=0,z)$ and $E_{LH}(k=0,z)$ are shown for the case of a host semiconductor comprising $Al_{0.7}Ga_{0.3}N$. Ideal metal contacts connect the extremities of the n-type and p-type superlattice with zero applied bias. Under forward bias diode conditions electrons and holes are injected into the intrinsic region 580, wherein they recombine and generate a photon having energy equal to a bandgap at the intrinsic region 580 minus the exciton binding energy.

Figure 6:
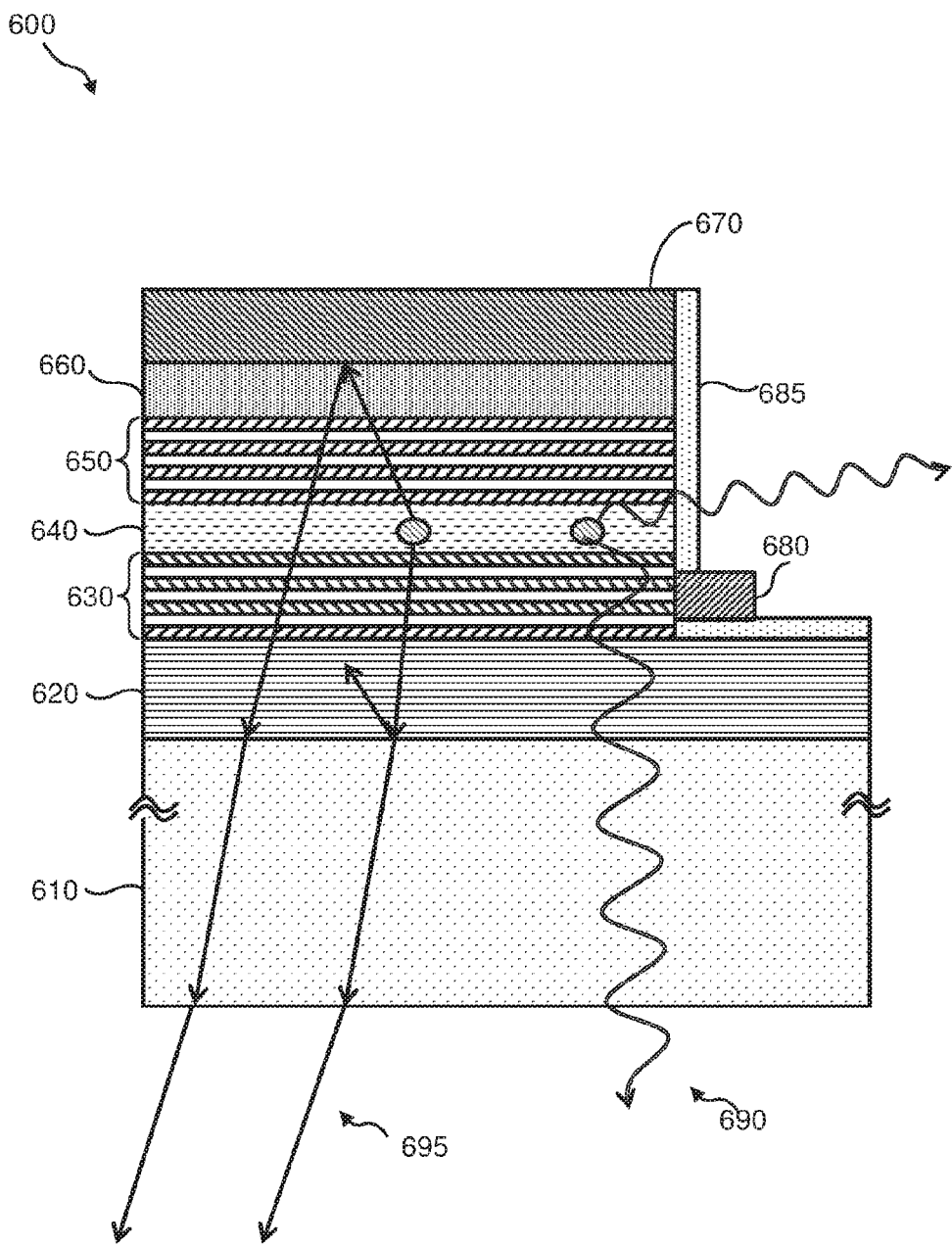
FIG. 6 is a cross-sectional view of an example LED device comprising an n-type contact and a p-type contact that is based on the structure of the electronic device shown in FIG. 5.

FIG. 6 is a cross-sectional view of an example of an LED device 600 that is based on the structure of the electronic device 500 shown in FIG. 5. The LED device 600 comprises a substrate 610, a buffer region 620, an n-type superlattice 630, an intrinsic layer 640, a p-type superlattice 650, and a p-type contact layer 660. The device can be produced by forming the buffer region 620, the n-type superlattice 630, the intrinsic layer 640, the p-type superlattice 650, and the p-type contact layer 660 in order on the substrate 610. The LED device 600 also comprises a p-type contact 670 and an n-type contact 680. The p-type contact 670 is formed on top of the p-type contact layer 660.

The p-type contact 670 and the n-type contact 680 are formed using known photolithographic processes. The n-type contact 680 is formed via a photolithographic process, wherein a portion of each of the p-type contact 670, the p-type contact layer 660, the p-type superlattice 650, the intrinsic layer 640 and the n-type superlattice 630 are removed in order to expose a defined area on the n-type superlattice 630. A passivation layer 685 is formed to cover exposed edges of the n-type superlattice 630, the intrinsic layer 640, the p-type superlattice 650 and the p-type contact layer 660 to prevent undesired conduction paths from the n-type contact to the buffer region 620, the n-type superlattice 630, the intrinsic layer 640, the p-type superlattice 650 and the p-type contact layer 660. In preferred embodiments, the passivation layer 685 consists of a wide band gap material having a wider band gap than the group III metal nitride semiconductor material of the host layers in the n-type superlattice 630 and the p-type superlattice 650.

In one embodiment, the substrate 610 is a transparent insulating substrate formed of sapphire and the p-type contact layer 660 is formed of highly doped p-type GaN. The thickness of the p-type contact layer 660 is between about 25 nm and about 200 nm in one example, and is about 50 nm in another example. The p-type contact 670 is preferably reflective and electrically conductive. A portion of the p-type contact 670 can be formed using Al for highly optical reflective operation in the 190 nm to 280 nm wavelength region, and a portion of the p-type contact 670 can be formed of a not optically reflective material as an ohmic contact. In preferred embodiments, the n-type contact 680 is formed of titanium nitride (TiN) and/or Aluminium. The passivation layer 685 consists essentially of an aluminium oxide ($Al_xO_y$), where $0<x\le2$ and $0<y\le3$, or another material that is electrically insulating and suppresses surface leakage loss across the device Light 690 that is emitted from the intrinsic layer 640 exits the LED device 600 vertically through the substrate 610 and also in the lateral direction. Because the p-type contact 670 can be engineered to be reflective, a portion of the light 690 that is emitted from the intrinsic layer 640 in the vertical direction through the p-type superlattice 650 can be reflected and exit the LED device 600 through the substrate 610 as reflected light 695.

The position of the intrinsic layer 640 within the electronic device 500 can be determined based on the design wavelength of the electronic device 500 as described hereinafter with reference to FIG. 7.

Figure 7:
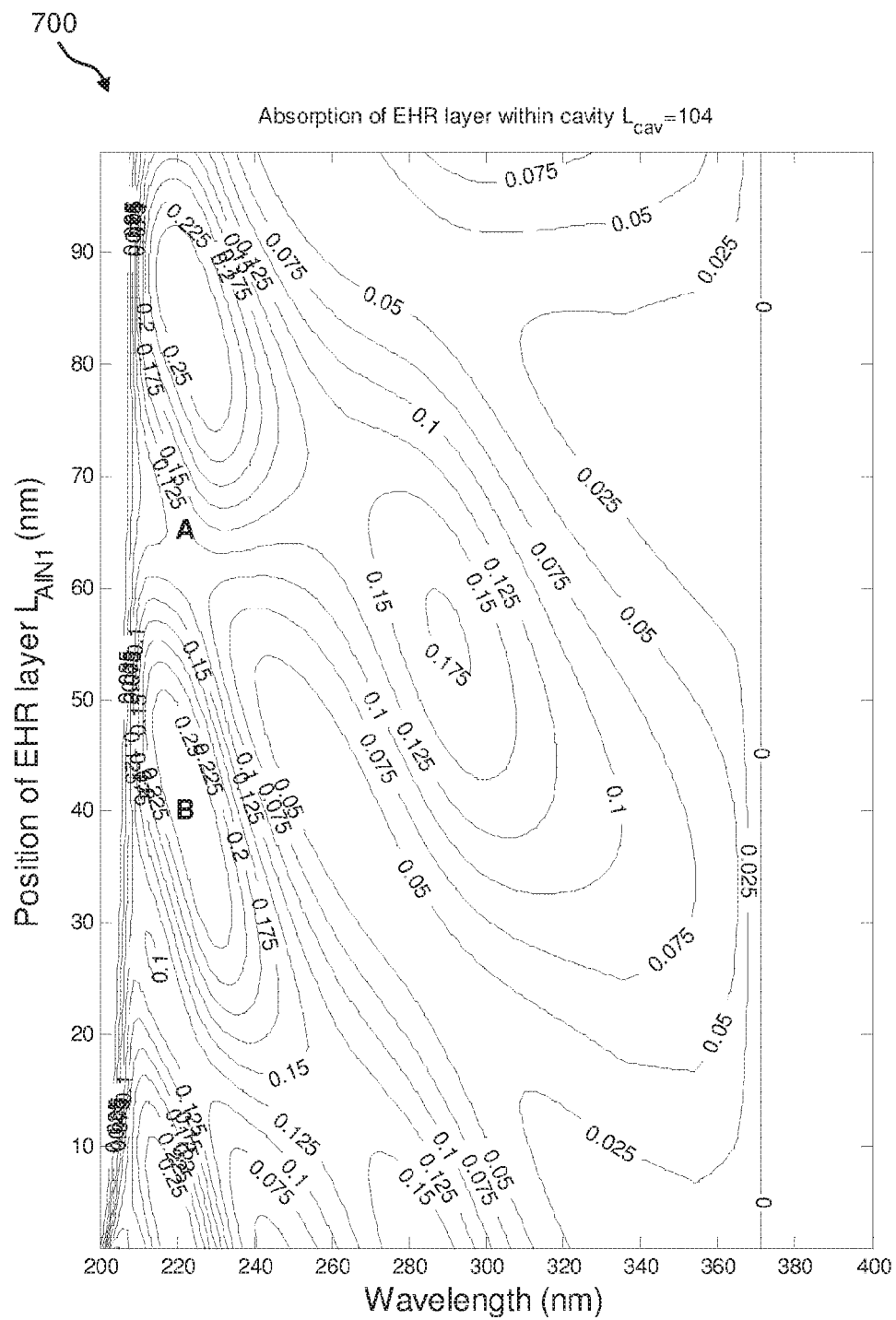
FIG. 7 is a plot of the light absorption in an intrinsic layer of the example LED device shown in FIG. 6 as a function of the position of the intrinsic layer in the LED device and the wavelength of the light.

FIG. 7 is a plot 700 showing an example of the absorption of light as viewed through the transparent substrate 610 in the intrinsic region 640 as a function of the position of the intrinsic region 640 within the LED device 600 and the wavelength of the light. In this example, the intrinsic region 640 consists essentially of AlN and the position of the intrinsic region 640 is measured from the top surface of the substrate 610 to the bottom surface of the intrinsic region 640. The light enters the LED device through the substrate 610 which is transparent and made from sapphire.

In this example, the host layers of the p-type superlattice and the n-type superlattice are formed of AlN, the p-type contact layer 660 is formed of undoped GaN, and the p-type contact 670 is reflective and at least a portion of the p-type contact is formed of Al.

The absorption within the intrinsic region of externally applied light incident through the transparent substrate correlates in a reciprocal nature with the emission of light from the intrinsic region out through the substrate. Therefore, the greater the absorption at a wavelength within the intrinsic region, the more efficiently that wavelength of light will be emitted from the intrinsic region of the LED device out through the substrate.

The plot 700 therefore depicts the emission of light from or the absorption of light within the intrinsic region of the electronic device as a function of the vertical position of the intrinsic region and the wavelength of light emitted from the electronic device. The intrinsic layer is the electron-hole recombination (EHR) layer within the LED device. Each of the contour lines defines a degree of light absorption by the intrinsic layer relative to wavelength and position. The values associated with each contour line are in arbitrary units. The greater the value of the contour line, the higher the absorption of light.

Plot 700 shows that light with a wavelength of about 220 nm is minimally absorbed at point A if the intrinsic region is positioned at about 65 nm and maximally absorbed at point B if the intrinsic region is positioned at about 40 nm. Light of a wavelength of 220 nm will therefore be emitted more efficiently from the LED device if the intrinsic region is positioned at 40 nm than if the intrinsic region is positioned at 65 nm. This is a direct consequence of interference effects within a microcavity formed in the device. The microcavity is formed by the n-type and p-type superlattices, the reflective contact and the transparent buffer layer and substrate. The thickness of the buffer plays an important role in the optimal position of EHR region. The calculation presented uses the full real and imaginary optical constants as a function of wavelength for the materials stated. Such a design method improves the optical extraction efficiency of light emitting structures.

Figure 8A:
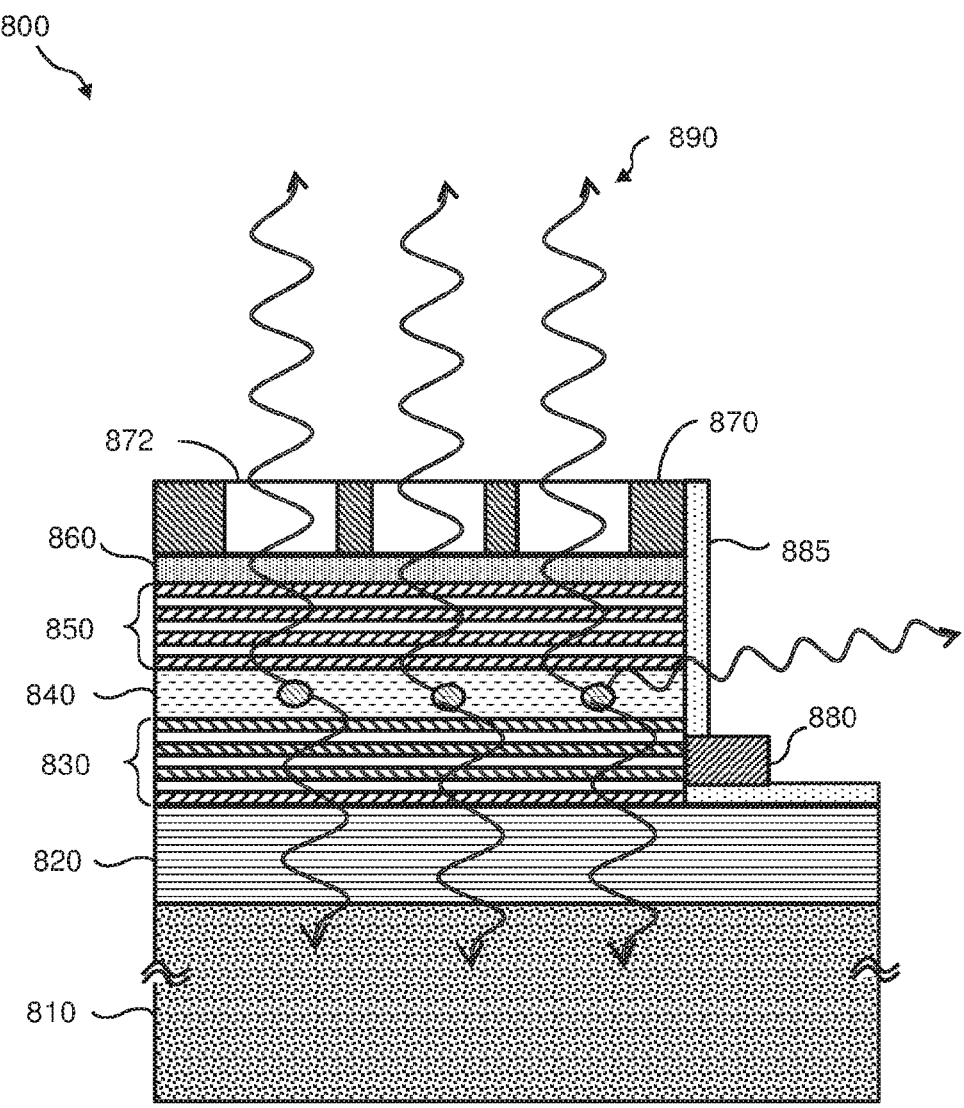
FIG. 8A is a cross-sectional view of an example LED device with openings in the p-type contact to enable light to be emitted through the top of the LED device.

FIG. 8A is a cross-sectional view of an example of an LED device 800 that is based on the electronic device 500 and the LED device 600 shown in FIGS. 4 and 5. The LED device 800 is a vertically emitting homojunction PIN diode.

The LED device 800 comprises a substrate 810, a buffer region 820, an n-type superlattice 830, an intrinsic layer 840, a p-type superlattice 850, and a p-type contact layer 860. The LED device 800 can be produced by forming the buffer region 820, the n-type superlattice 830, the intrinsic layer 840, the p-type superlattice 850, and the p-type contact layer 860 in order on the substrate 810. The LED device 800 also comprises a p-type contact 870 and an n-type contact 880. The p-type contact 870 is formed on top of the p-type contact layer 860.

The substrate 810 is a non-transparent insulating substrate, consisting essentially of Si and the p-type contact 870 is patterned as a grid having a plurality of openings 872. Light 890 emitted from the intrinsic region 840 is emitted from the device through the openings 872. The light 890 emitted from the intrinsic region 840 also exits the LED device 800 in the lateral direction. "Laterally" or "lateral" refers to the direction substantially along the plane of the layers, while "vertically" or "vertical" refers to the direction substantially perpendicular or normal to the plane of the layers.

Figure 8B:
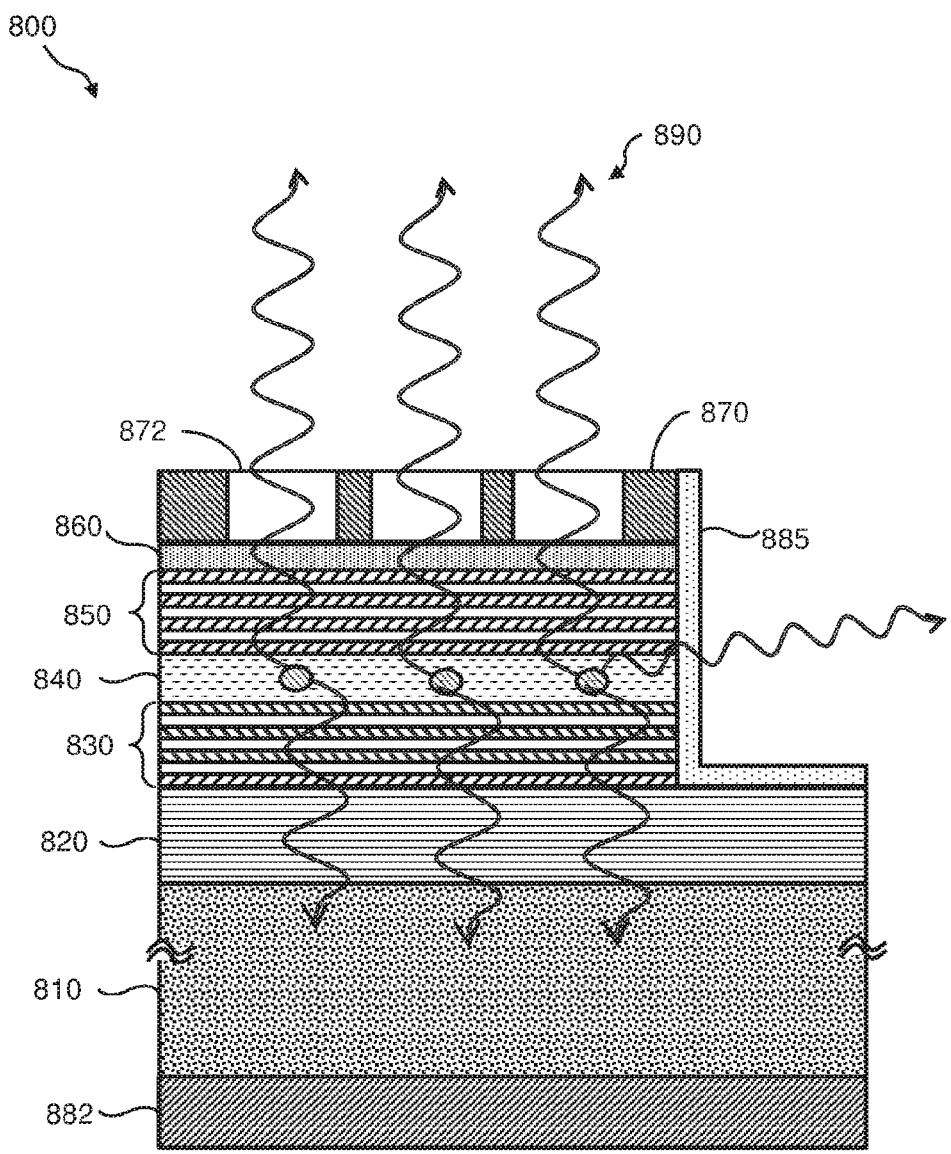
FIG. 8B is a cross-sectional view of another example LED device where the n-type contact has been replaced with an ohmic contact.

FIG. 8B is a cross-sectional view of an example of an LED device 802 based on the LED device 800 shown in FIG. 8A. In the LED device 802, the substrate 810 is a non-transparent, conductive substrate. For example, such a substrate can be made of Si or GaN (if the emission wavelength is in the range of 190-280nm) that has been electrically doped to a high level of conductivity. An ohmic contact 882 is formed on the bottom of the substrate 810 and the n-type contact 880 is omitted. The ohmic contact 882 can be formed, for example, of Al if the substrate 810 is n-type, or of a high work function metal, such as Nickel or Osmium, if the substrate 810 is p-type. The contact resistance between the substrate 810 and the buffer region 820 can be further improved by recessing into the substrate 810 trenched regions of ohmic metal to further increase the contact area and improve the heat extraction efficiency.

In some embodiments, the substrate 810 and the ohmic contact 882 comprise one or more windows or openings to enable light to leave the electronic device.

Figure 9:
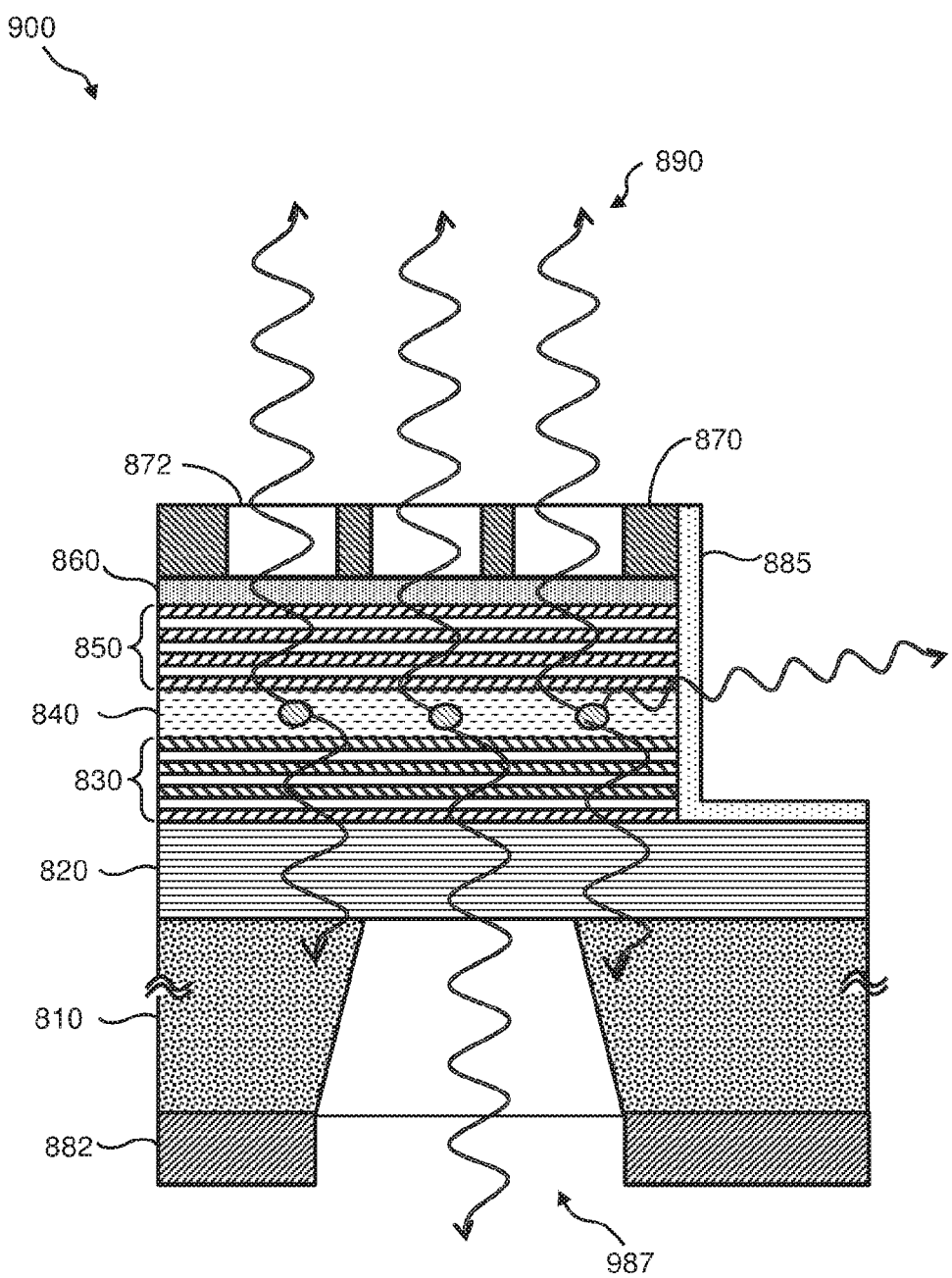
FIG. 9 is a cross-sectional view of the example LED device shown in FIG. 8B adapted to have a window through a substrate and the ohmic contact.

FIG. 9 is a cross-sectional view of an example of an LED device 900. In this example, after forming the LED device 800 shown in FIG. 8B, a portion of the ohmic contact 882 and a portion of the substrate 810 are removed to form a window 987. In one example, the window 987 is formed using a photolithography process, wherein a portion of the ohmic contact 882 and a portion of the substrate 810 are removed in order to expose a defined area on the buffer layer 820. Light 890 is emitted from the LED device 900 through the window 987 and the openings 872. Light 890 is also emitted through the passivation layer 885. In some embodiments, an antireflective coating can be formed on a back side of the window 987 to improve light extraction or optical coupling.

Figure 10A:
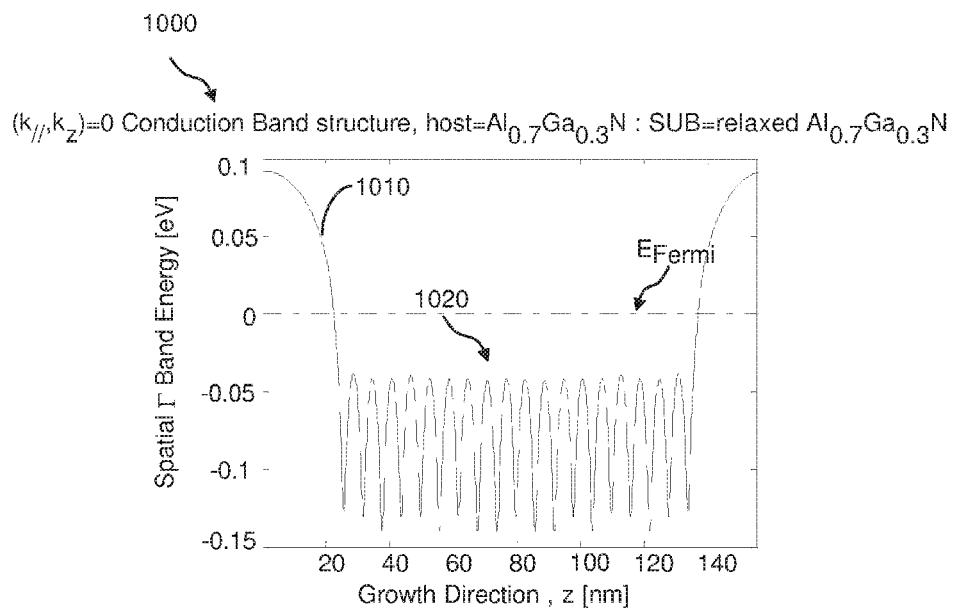
FIG. 10A is an energy band diagram of the conduction band energy in an n-type superlattice having host layers consisting of an aluminium-gallium-nitride ($Al_{0.7}Ga_{0.3}N$) and nineteen donor impurity layers consisting of silicon (Si).

FIG. 10A is an energy band diagram 1000 of the conduction band energy in an n-type superlattice comprising host layers consisting essentially of $Al_{0.7}Ga_{0.3}N$ and 19 donor impurity layers consisting essentially of Si.

The energy band diagram 1000 shows a conduction band 1010 as a function of the distance z through the n-type superlattice. The thickness of each donor impurity layer is 1 nm, and the distance between each donor impurity layer is 5 nm. As can be seen in the diagram 1000, the donor impurity layers shift the position of the conduction band 1010 energy toward the Fermi energy $E_{Fermi}$ and induce a series of 19 potential wells 1020.

Figure 10B:
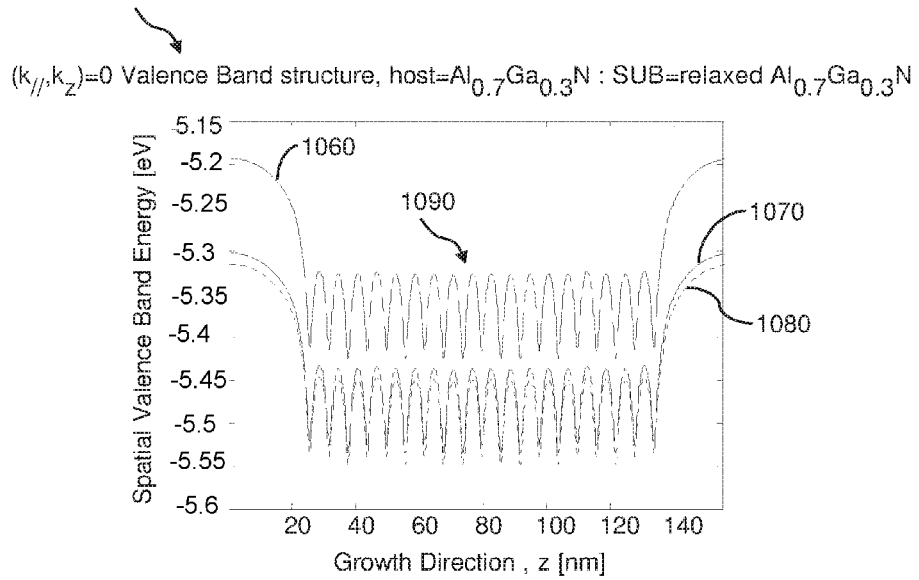
FIG. 10B is an energy band diagram of the valence band energies in the same n-type superlattice as FIG. 10A.

FIG. 10B is an energy band diagram 1050 of the valence band energies in the n-type superlattice. The energy band diagram 1050 shows a crystal field split (CH) band 1060, a heavy hole (HH) band 1070, and a light hole (LH) band 1080 as a function of the distance z through the n-type superlattice. As can be seen in the diagram 1050, the donor impurity layers shift the position of the valence band energies and induce a series of 19 potential wells 1090 in the CH band 1060, the HH band 1070, and the LH band 1080. Because the n-type superlattice is n-type, the Fermi energy $E_{Fermi}$ is in the conduction band 1010 and is not in the valance band.

Referring again to both FIG. 10A and FIG. 10B the potential wells induced in the conduction and valence bands are seen to form a type-II band alignment. That is, the localized electron and hole wavefunctions in their respective bands are not vertically aligned. Therefore, the type-II band alignment induces an optical transparency in the n-type and p-type superlattices that is larger in energy than the transparency of the semiconductor material of the host layer alone. This provides the required transparency in the n-type and p-type superlattice for the passing of photogenerated light from the intrinsic region.

Figure 11A:
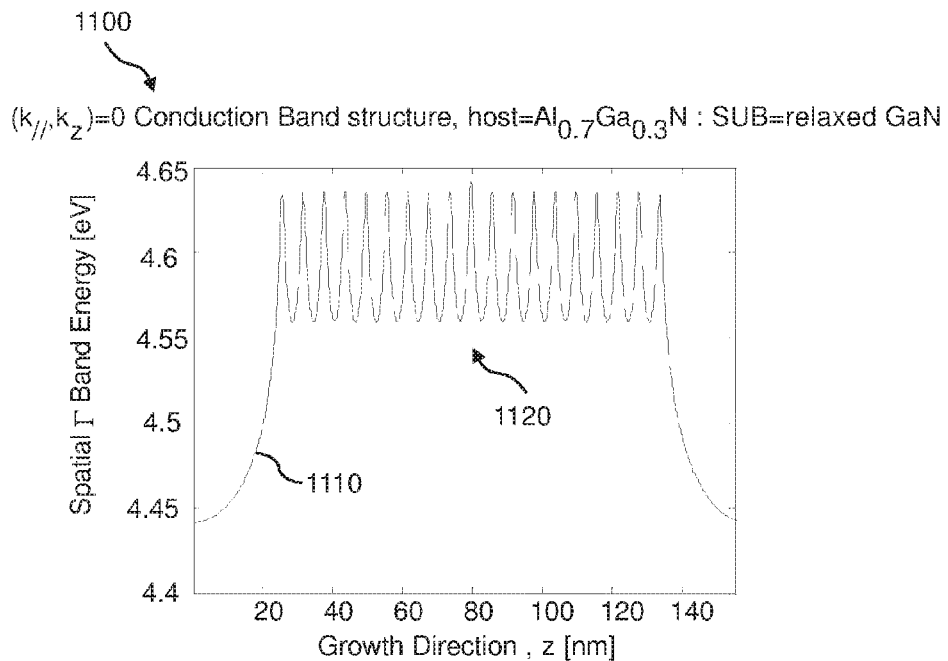
FIG. 11A is an energy band diagram of the conduction band energy in a tensile-strained p-type superlattice having host layers consisting of $Al_{0.7}Ga_{0.3}N$ and nineteen acceptor impurity layers consisting of magnesium (Mg) formed on a relaxed GaN buffer layer.

FIG. 11A is an energy band diagram 1100 of the conduction band energy in a tensile-strained p-type superlattice comprising host layers consisting essentially of $Al_{0.7}Ga_{0.3}N$ and 19 acceptor impurity layers consisting essentially of Mg. The p-type superlattice is tensile strained and deposited on a relaxed GaN buffer layer.

The energy band diagram 1100 shows a conduction band 1110 as a function of the distance z through the p-type superlattice. The thickness of each acceptor impurity layer is 1 nm, and the distance between each acceptor impurity layer is 5 nm. The acceptor impurity layers shift the position of the conduction band 1110 energy and induce a series of 19 potential wells 1120.

Figure 11B:
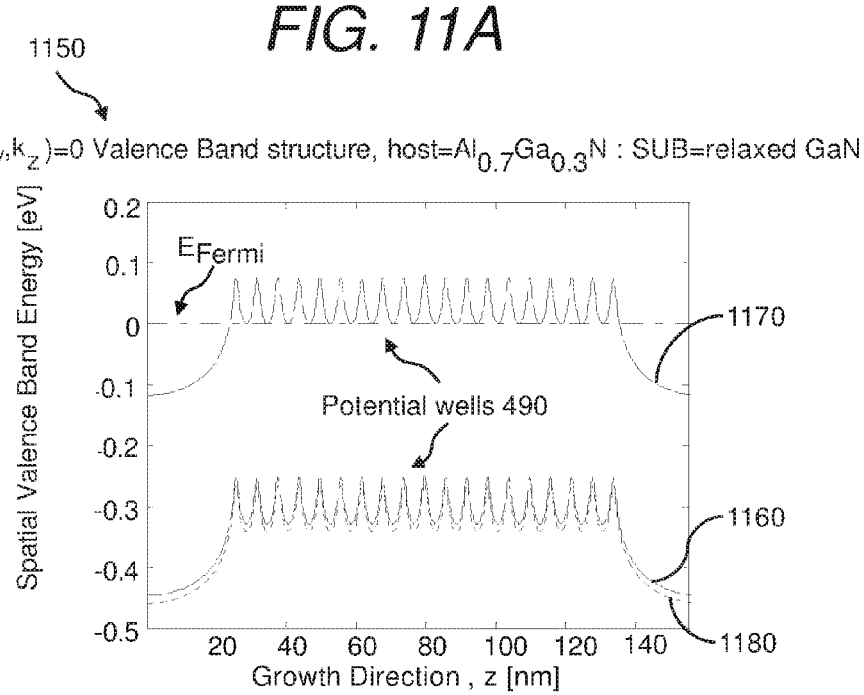
FIG. 11B is an energy band diagram of the valence band energies in the same p-type superlattice as FIG. 11A.

FIG. 11B is an energy band diagram 1150 of the valence band energies in the tensile-strained p-type superlattice. The energy band diagram 1150 shows a crystal field split (CH) band 1160, a heavy hole (HH) band 1170, and a light hole (LH) band 1180 as a function of the distance z through the p-type superlattice. The acceptor impurity layers shift the position of the valence band energies and induce a series of 19 potential wells 1190 in the CH band 1160, the HH band 1170, and the LH band 1180. Because the p-type superlattice is p-type, the Fermi energy $E_{Fermi}$ is in the valance band.

Figure 12A:
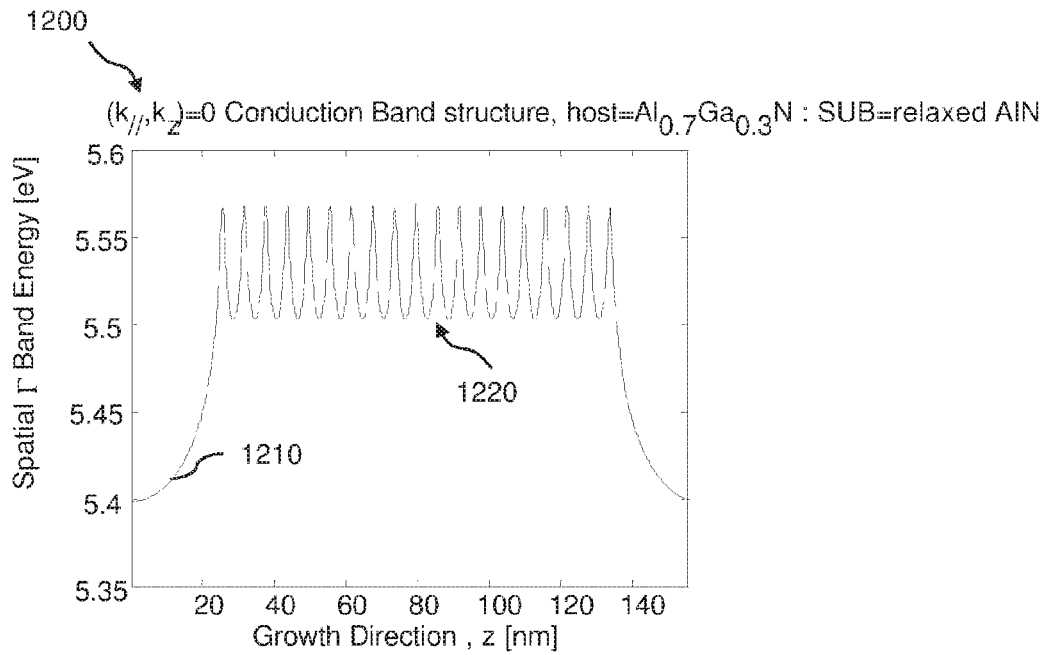
FIG. 12A is an energy band diagram of the conduction band energy in a compressively strained p-type superlattice having host layers consisting of $Al_{0.7}Ga_{0.3}N$ and nineteen acceptor impurity layers consisting of Mg formed on a relaxed AlN buffer layer.

FIG. 12A is an energy band diagram 1200 of the conduction band energy in a compressively strained p-type superlattice comprising host layers consisting essentially of $Al_{0.7}Ga_{0.3}N$ and 19 acceptor impurity layers consisting essentially of Mg. The p-type superlattice is compressively strained and deposited on a relaxed AlN buffer layer.

The energy band diagram 1200 shows a conduction band 1210 as a function of the distance z through the p-type superlattice. The thickness of each acceptor impurity layer is 1 nm, and the distance between each acceptor impurity layer is 5 nm. The impurity layers shift the position of the conduction band 1210 energy and induce a series of 19 potential wells 1220.

Figure 12B:
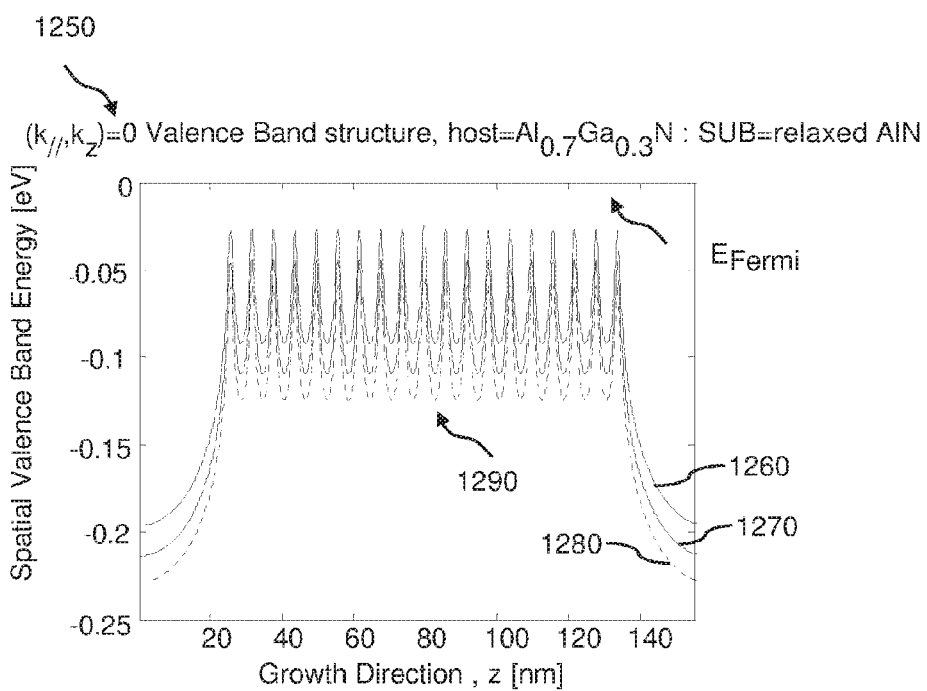
FIG. 12B is an energy band diagram of the valence band energies in the same p-type superlattice as FIG. 12A.

FIG. 12B is an energy band diagram 1250 of the valence band energies in the compressively strained p-type superlattice. The energy band diagram 1250 shows a crystal field split (CH) band 1260, a heavy hole (HH) band 1270, and a light hole (LH) band 1280 as a function of the distance z through the p-type superlattice. The acceptor impurity layers shift the position of the valence band energies and induce a series of 19 potential wells 1290 in the CH band 1260, the HH band 1270, and the LH band 1280. Because the p-type superlattice is p-type, the Fermi energy $E_{Fermi}$ is in the valance band.

Figure 13A:
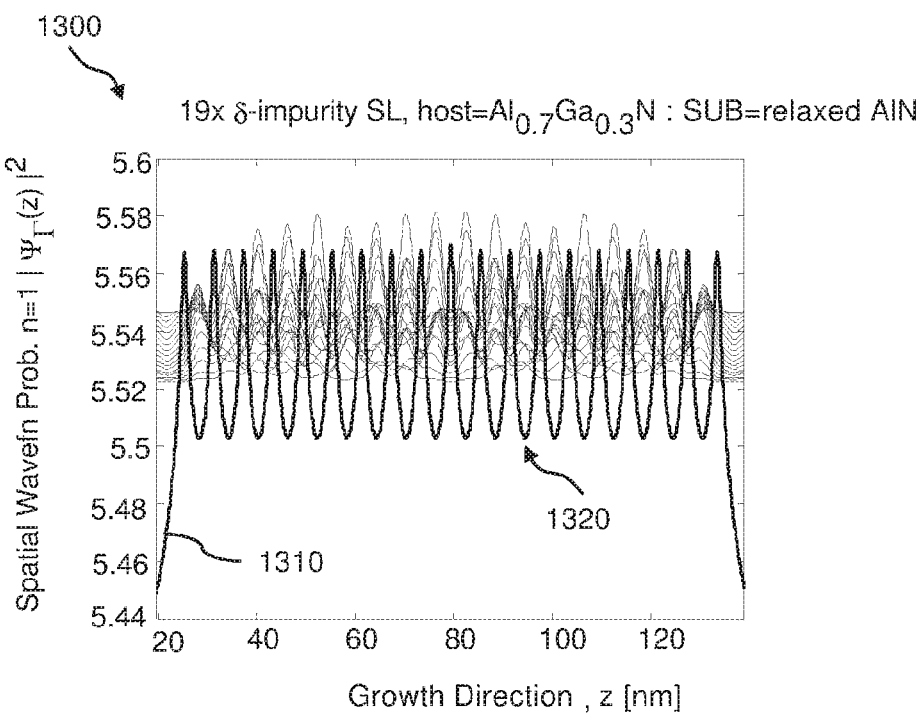
FIG. 13A is a plot of the 19 lowest energy, quantized electron wavefunctions plotted relative to the conduction band in the same superlattice as FIG. 12A.

FIG. 13A is a plot 1300 of the 19 lowest energy quantized electron wavefunctions relative to the conduction band 1210 in the p-type superlattice shown in FIG. 12A. The plot 1300 shows that the peaks of the electron wavefunctions, as a function of the distance z through the p-type superlattice, are localized to the induced potential wells 1220 in the conduction band 1210 (shown in FIG. 13A as 1320 and 1310, respectively). A peak represents a high probability of finding an electron at a certain location and a plateau represents a low probability of finding an electron at a certain location.

Figure 13B:
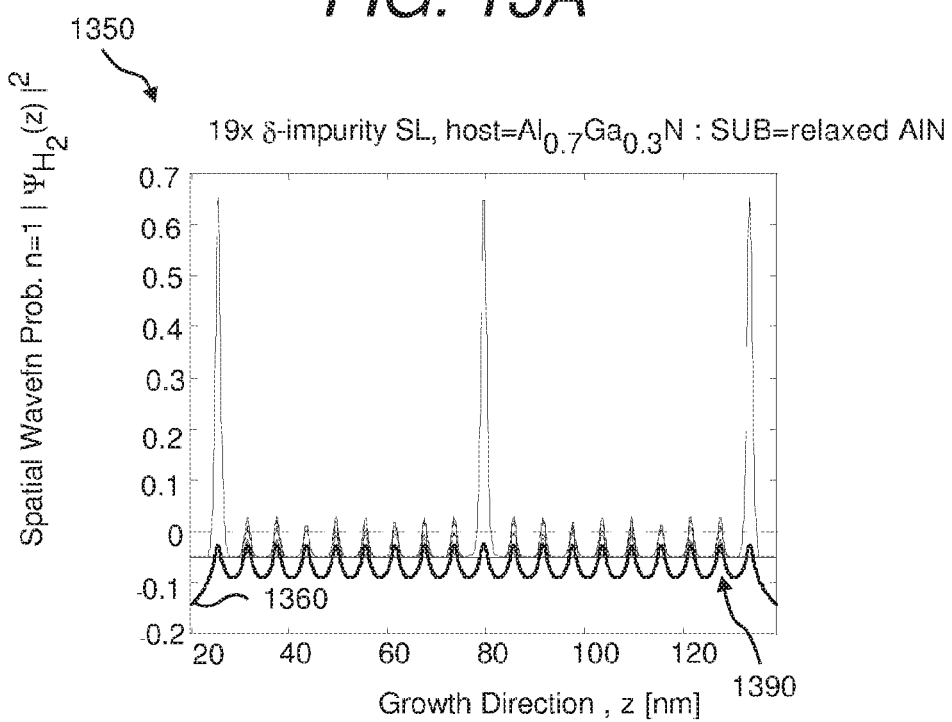
FIG. 13B is a plot of the 19 lowest energy, quantized hole wavefunctions plotted relative to the CH band in the same superlattice as FIG. 12B.

FIG. 13B is a plot 1350 of the 19 lowest energy, quantized hole wavefunctions relative to the CH band 1360 in the p-type superlattice shown in FIG. 12B. The plot 1350 shows that the peaks of the hole wavefunctions, as a function of the distance z through the p-type superlattice, are localized to the induced potential wells 1290 in the CH band 1260 (shown in FIG. 13B as 1390 and 1360, respectively). A comparison of the electron wavefunctions shown in the plot 1300 and the hole wavefunctions shown in the plot 1350 indicates that the electron wavefunctions are not aligned with the hole wavefunctions; that is, the peak distribution for electrons does not overlap the peak distribution for holes. Because the probability of spatial overlap of electron and holes is low, recombination of electrons and holes is reduced and the p-type superlattice is transparent to the design wavelength.

Referring again to the superlattice of FIG. 13A and FIG. 13B, the electron wavefunctions along the growth direction for electrons and holes, respectively, are delocalized spatially which provides a coupling between impurity layers and thus improves p-type conductivity of the superlattice. The extremely high density of dopant species confined within the impurity layer reduces the activation energy $E_{act}$ of the dopant with respect to the host band structure. This increases the activated carrier concentration for a given substrate temperature during device operation compared to devices where the p-type and n-type region comprise conventional uniformly doped host semiconductors. Furthermore, the coupling of wavefunctions between impurity layers of the donor or acceptor materials improves carrier transport through the device.

Similarly, in some embodiments of the devices comprising n-type superlattice and/or the p-type superlattices previously described, the peaks of the electron wavefunction are not spatially aligned with peaks of the hole wavefunction.

FIG. 10A through FIG. 12B show that the bi-axial strain generated within the superlattice, by pseudomorphic growth on a relaxed buffer layer, can alter the conduction band and valence band profiles. For example, referring to FIG. 12A through FIG. 12B, the fundamental energy gap opens up with compressive strain, and referring to FIG. 11A and FIG. 11B, the fundamental energy gap is reduced with tensile strain. The energy gap directly affects the relative position of the n=1 quantized energy levels relative to the Fermi energy $E_{Fermi}$. For example, a decrease in the energy gap between the n=1 quantized hole states in a p-type superlattice and the Fermi energy $E_{Fermi}$ can be used to enhance the activated doping concentration in the p-type superlattice. That is, strain may be used to improve the activated doping concentration in a superlattice.

The electronic devices described herein have advantages over conventional heterojunction UV LEDs, in that they have improved light emission from the intrinsic layer or active region of the device. For example, the electronic devices of the present invention are homojunction devices and therefore devoid of the internal polarization fields that typically occur in heterojunction devices.

The superlattices can be designed to be transparent to the design wavelength of the electronic device to enable light to be emitted through the n-type or p-type semiconductor region while achieving a high level of n-type or p-type conductivity. Furthermore, the electrical (e.g., carrier concentration) and optical (e.g., optical transparency at the design wavelength) properties of the superlattices can be changed by varying the period and the duty cycle of the unit cells of the superlattice.

It should be appreciated that in the electronic devices shown herein the n-type and p-type superlattices and contacts may be swapped such that the p-type superlattice is grown first. However, a reason for growing the n-type superlattice first is that it is generally easier to grow an n-type superlattice on a substrate or buffer layer than a p-type superlattice.

In this specification, the term "superlattice" refers to a layered structure comprising a plurality of repeating unit cells including two or more layers, where the thickness of the layers in the unit cells is small enough that there is significant wavefunction penetration between corresponding layers of adjacent unit cells such that quantum tunnelling of electrons and/or holes can readily occur.

The reference to any prior art in this specification is not, and should not be taken as, an acknowledgement or any form of suggestion that the prior art forms part of the common general knowledge.

In this specification, the terms "comprise", "comprises", "comprising" or similar terms are intended to mean a non-exclusive inclusion, such that a system, method or apparatus that comprises a list of elements does not include those elements solely, but may well include other elements not listed.

What is claimed is:

1. A method of making a p-type or n-type superlattice via a film formation process, the method comprising the steps of:
    a. loading a substrate into a reaction chamber;
    b. heating the substrate to a film formation temperature;
    c. forming on the substrate a host layer consisting essentially of a semiconductor material;
    d. forming above the host layer an impurity layer consisting of a monolayer of donor or acceptor atoms;
    e. forming above the impurity layer another host layer consisting essentially of the semiconductor material;
    f. repeating steps (d) to (e) until the superlattice reaches a desired thickness or comprises a desired number of layers;
    g. before step (d), forming a first nitrogen terminated surface on the host layer; and
    h. before step (e), forming a second nitrogen terminated surface on the impurity layer;
    wherein:
    step (d) further comprises forming the impurity layer on the first nitrogen terminated surface;
    step (e) further comprises forming the other host layer on the second nitrogen terminated surface; and
    the host layers consist essentially of a group III metal nitride semiconductor material.

2. The method of claim 1 wherein the semiconductor material is selected from at least one of:
    aluminium nitride (AlN);
    aluminium gallium nitride ($Al_xGa_{1-x}N$) where $0<x<1$;
    aluminium indium nitride ($Al_xIn_{1-x}N$) where $0<x<1$; and
    aluminium gallium indium nitride ($Al_xGa_yIn_{1-x-y}N$) where $0<x<1$, $0<y<1$ and $x+y<1$.

3. The method of claim 1 wherein the donor atoms are silicon (Si).

4. The method of claim 1 wherein the donor atoms are germanium (Ge).

5. The method of claim 1 wherein the acceptor atoms are magnesium (Mg).

6. The method of claim 1 wherein the acceptor atoms are selected from at least one of:
    zinc (Zn); and
    carbon (C).

7. The method of claim 1 wherein:
    the repeating of steps (d) to (e) is conducted until the superlattice reaches the desired number of layers; and
    the desired number of layers is at least 10 host layers and at least 10 impurity layers.

8. The method of claim 1 wherein the film formation process is a vacuum deposition process, a molecular beam epitaxy process or a vapour phase deposition process.

9. The method of claim 1 wherein the film formation temperature is between about 500 °C. and about 850 °C.

10. The method of claim 1 wherein the desired thickness is between about 50 nm and about 5 μm.

11. The method of claim 1 wherein the reaction chamber is sufficiently deficient of hydrogen (H), oxygen (O) and carbon (C) species so as to not impact the electronic or structural quality of the superlattice.

12. The method of claim 1 comprising growth interruptions for nitrogen terminated surface preparation using excited molecular nitrogen species.

13. The method of claim 1 wherein the host layers and the impurity layers have a substantially metal polar polarity along a growth direction or a nitrogen polarity along the growth direction.

14. A method of making an electronic device comprising an n-type superlattice providing n-type conductivity and a p-type superlattice providing p-type conductivity, the method comprising the steps of:
    a. for the n-type superlattice, forming on a substrate a first host layer consisting essentially of a group III metal nitride semiconductor material;
    b. forming above the first host layer a donor impurity layer consisting of a monolayer of donor atoms;
    c. forming above the donor impurity layer a second host layer consisting essentially of the group III metal nitride semiconductor material;
    d. repeating steps (b) to (c) until the n-type superlattice reaches a desired thickness or comprises a desired number of alternating host layers and donor impurity layers;
    e. for the p-type superlattice, forming above the n-type superlattice a third host layer consisting essentially of the group III metal nitride semiconductor material;
    f. forming above the third host layer an acceptor impurity layer consisting of a monolayer of acceptor atoms;
    g. forming above the acceptor impurity layer a fourth host layer consisting essentially of the group III metal nitride semiconductor material; and
    h. repeating steps (f) to (g) until the p-type superlattice reaches a desired thickness or comprises a desired number of alternating host layers and acceptor impurity layers;
    wherein the group III metal in the group III metal nitride semiconductor material comprises at least about 50% Al by mol.

15. The method of claim 14 wherein the electronic device is an ultraviolet light emitting diode or an ultraviolet light detector.

16. The method of claim 14 further comprising:
between steps (d) and (e), forming an intrinsic region comprised of one or more group III metal nitride semiconductor materials, wherein the n-type superlattice, the intrinsic region, and the p-type superlattice form a PIN junction.

17. The method of claim 16 wherein the intrinsic region has a bandgap that varies along a growth direction.

18. The method of claim 14 wherein each host layer has a thickness between about 1 nm and about 25 nm.

* * * * *